US011121298B2

(12) United States Patent
Murthy et al.

(10) Patent No.: US 11,121,298 B2
(45) Date of Patent: *Sep. 14, 2021

(54) LIGHT-EMITTING DIODE PACKAGES WITH INDIVIDUALLY CONTROLLABLE LIGHT-EMITTING DIODE CHIPS

(71) Applicant: Cree, Inc., Durham, NC (US)

(72) Inventors: Roshan Murthy, Raleigh, NC (US); Kenneth M. Davis, Raleigh, NC (US); Jae-Hyung Park, Cary, NC (US); Xiameng Shi, Cary, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/118,762

(22) Filed: Aug. 31, 2018

(65) Prior Publication Data

US 2019/0363232 A1 Nov. 28, 2019

Related U.S. Application Data

(60) Provisional application No. 62/676,697, filed on May 25, 2018.

(51) Int. Cl.
*H01L 33/62* (2010.01)
*H01L 25/075* (2006.01)
(Continued)

(52) U.S. Cl.
CPC ............ *H01L 33/62* (2013.01); *G02B 5/0205* (2013.01); *G02B 27/0955* (2013.01);
(Continued)

(58) Field of Classification Search
CPC ......... H01L 33/62; H01L 33/60; H01L 33/54; H01L 33/505; H01L 22/30–34;
(Continued)

(56) References Cited

U.S. PATENT DOCUMENTS 2,857,541 A 10/1958 Etzel et al.
4,918,497 A 4/1990 Edmond
(Continued)

FOREIGN PATENT DOCUMENTS

CN 102214651 A 10/2011
CN 103864302 A 6/2014
(Continued)

OTHER PUBLICATIONS

Nichia Corporation, "NC3W321AT: Specifications for White LED," NICHIA STS-DA1-4281A <Cat. No. 160603>, [online], [retrieved on May 21, 2018] Retrieved from Nichia Corporation using Internet <URL: http://www.nichia.co.jp/en/product/led.html>, 16 pages.
(Continued)

*Primary Examiner* — Matthew C Landau
*Assistant Examiner* — Eric K Ashbahian
(74) *Attorney, Agent, or Firm* — Withrow & Terranova, PLLC

(57) ABSTRACT

Solid-state light emitting devices including light-emitting diodes (LEDs), and more particularly packaged LEDs that include individually controllable LED chips are disclosed. In some embodiments, an LED package includes electrical connections configured to reduce corrosion of metals within the package; or decrease the overall forward voltage of the LED package; or provide an electrical path for electrostatic discharge (ESD) chips. In some embodiments, an LED package includes an array of LED chips, each of which is individually controllable such that individual LED chips or subgroups of LED chips may be selectively activated or deactivated. A single wavelength conversion element may be provided over the array of LED chips, or separate wavelength conversion elements may be provided over one or more individual LED chips of the array. Representative LED packages may be beneficial for applications where a
(Continued)

high luminous intensity with a controllable brightness or adaptable emission pattern is desired.

25 Claims, 28 Drawing Sheets

(51) Int. Cl.
| | |
|---|---|
| H01L 25/16 | (2006.01) |
| H01L 33/64 | (2010.01) |
| H01L 21/66 | (2006.01) |
| H01L 33/50 | (2010.01) |
| H01L 33/60 | (2010.01) |
| H01L 27/02 | (2006.01) |
| G02B 5/02 | (2006.01) |
| G02B 27/09 | (2006.01) |
| H01L 23/00 | (2006.01) |
| H01L 33/10 | (2010.01) |

(52) U.S. Cl.
CPC .............. *H01L 22/32* (2013.01); *H01L 24/04* (2013.01); *H01L 25/0753* (2013.01); *H01L 25/167* (2013.01); *H01L 27/0248* (2013.01); *H01L 33/10* (2013.01); *H01L 33/502* (2013.01); *H01L 33/60* (2013.01); *H01L 33/647* (2013.01)

(58) Field of Classification Search
CPC .............. H01L 25/167; H01L 25/0753; H01L 2933/0066; H01L 2224/73265; G09G 2300/0426
See application file for complete search history.

(56) References Cited

U.S. PATENT DOCUMENTS

| | | | |
|---|---|---|---|
| 4,966,862 | A | 10/1990 | Edmond |
| 5,027,168 | A | 6/1991 | Edmond |
| 5,177,500 | A * | 1/1993 | Ng ............................. B41J 2/45 257/88 |
| 5,210,051 | A | 5/1993 | Carter, Jr. |
| 5,338,944 | A | 8/1994 | Edmond et al. |
| 5,359,345 | A | 10/1994 | Hunter |
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond et al. |
| 5,912,477 | A | 6/1999 | Negley |
| 6,034,422 | A | 3/2000 | Horita et al. |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,274,399 | B1 | 8/2001 | Kern et al. |
| 6,600,175 | B1 | 7/2003 | Baretz et al. |
| 6,646,330 | B2 | 11/2003 | Kubara et al. |
| 6,649,440 | B1 | 11/2003 | Krames et al. |
| 6,791,119 | B2 | 9/2004 | Slater, Jr. et al. |
| 6,853,010 | B2 | 2/2005 | Slater, Jr. et al. |
| 6,958,497 | B2 | 10/2005 | Emerson et al. |
| 7,095,056 | B2 | 8/2006 | Vitta et al. |
| 7,213,940 | B1 | 5/2007 | Van De Ven et al. |
| 7,344,902 | B2 | 3/2008 | Basin et al. |
| 7,361,938 | B2 | 4/2008 | Mueller et al. |
| D572,387 | S | 7/2008 | Uemoto et al. |
| D573,731 | S | 7/2008 | Uemoto et al. |
| 7,456,499 | B2 | 11/2008 | Loh et al. |
| 7,495,387 | B2 * | 2/2009 | Hayashi ............... H01L 51/5225 313/505 |
| 7,564,180 | B2 | 7/2009 | Brandes |
| D597,502 | S | 8/2009 | Ogata et al. |
| 7,655,957 | B2 | 2/2010 | Loh et al. |
| D611,628 | S | 3/2010 | Uemoto et al. |
| D612,958 | S | 3/2010 | Uemoto et al. |
| 7,754,507 | B2 | 7/2010 | Epler et al. |
| 7,791,061 | B2 | 9/2010 | Edmond et al. |
| 7,802,901 | B2 | 9/2010 | McMillan |
| 7,821,023 | B2 | 10/2010 | Yuan et al. |
| 7,847,303 | B2 | 12/2010 | Jung et al. |
| 7,928,648 | B2 | 4/2011 | Jang et al. |
| 7,952,544 | B2 | 5/2011 | Roberts |
| 7,960,819 | B2 | 6/2011 | Loh et al. |
| 7,999,283 | B2 | 8/2011 | Chakraborty et al. |
| 8,018,135 | B2 | 9/2011 | Van De Ven et al. |
| 8,044,418 | B2 | 10/2011 | Loh et al. |
| 8,058,088 | B2 | 11/2011 | Cannon et al. |
| 8,075,165 | B2 | 12/2011 | Jiang et al. |
| 8,125,137 | B2 | 2/2012 | Medendorp, Jr. et al. |
| 8,232,564 | B2 | 7/2012 | Chakraborty |
| 8,264,138 | B2 | 9/2012 | Negley |
| 8,337,071 | B2 | 12/2012 | Negley et al. |
| 8,362,512 | B2 | 1/2013 | Hussell et al. |
| 8,384,097 | B2 | 2/2013 | Yan |
| 8,390,022 | B2 | 3/2013 | Hussell et al. |
| 8,410,679 | B2 | 4/2013 | Ibbetson et al. |
| 8,425,271 | B2 | 4/2013 | Hussell et al. |
| 8,563,339 | B2 | 10/2013 | Tarsa et al. |
| 8,598,793 | B2 | 12/2013 | Yan et al. |
| D703,841 | S | 4/2014 | Feng et al. |
| 8,729,589 | B2 | 5/2014 | Hussell et al. |
| 8,822,032 | B2 | 9/2014 | Borrelli et al. |
| 8,866,410 | B2 | 10/2014 | Negley et al. |
| 8,940,561 | B2 | 1/2015 | Donofrio et al. |
| 8,970,131 | B2 | 3/2015 | Brandes et al. |
| 8,998,444 | B2 | 4/2015 | Roberts et al. |
| 9,024,340 | B2 | 5/2015 | Minato et al. |
| 9,024,349 | B2 | 5/2015 | Chitnis et al. |
| 9,053,958 | B2 | 6/2015 | Donofrio et al. |
| 9,131,561 | B2 | 9/2015 | Athalye |
| 9,159,888 | B2 | 10/2015 | Chitnis et al. |
| 9,192,013 | B1 | 11/2015 | van de Ven et al. |
| 9,277,605 | B2 | 3/2016 | Ni |
| 9,310,026 | B2 | 4/2016 | Negley |
| D756,547 | S | 5/2016 | Zhang et al. |
| 9,414,454 | B2 | 8/2016 | Brandes et al. |
| 9,461,222 | B1 | 10/2016 | Wei |
| 9,713,211 | B2 | 7/2017 | van de Ven et al. |
| D797,321 | S | 9/2017 | Liu |
| 9,816,691 | B2 | 11/2017 | Yan |
| 9,893,243 | B2 | 2/2018 | West et al. |
| 10,057,983 | B1 * | 8/2018 | Etzkorn ............... H05K 1/0298 |
| 10,211,187 | B2 | 2/2019 | Crompvoets et al. |
| D851,790 | S | 6/2019 | Reiherzer et al. |
| 10,651,353 | B2 | 5/2020 | Senuki et al. |
| 2004/0048219 | A1 | 3/2004 | Yun |
| 2005/0127385 | A1 | 6/2005 | Reeh et al. |
| 2006/0221272 | A1 | 10/2006 | Negley et al. |
| 2007/0104828 | A1 | 5/2007 | Fornaguera |
| 2007/0241661 | A1 | 10/2007 | Yin |
| 2008/0036940 | A1 | 2/2008 | Song et al. |
| 2008/0258130 | A1 | 10/2008 | Bergmann et al. |
| 2009/0001490 | A1 | 1/2009 | Bogner et al. |
| 2009/0021841 | A1 | 1/2009 | Negley et al. |
| 2009/0039375 | A1 | 2/2009 | LoToquin et al. |
| 2009/0050908 | A1 | 2/2009 | Yuan et al. |
| 2009/0051022 | A1 | 2/2009 | Andoh |
| 2009/0166665 | A1 | 7/2009 | Haitko |
| 2009/0261708 | A1 | 10/2009 | Moseri et al. |
| 2009/0316409 | A1 | 12/2009 | Kim et al. |
| 2010/0154035 | A1 | 6/2010 | Damola et al. |
| 2010/0244060 | A1 | 9/2010 | Lee et al. |
| 2010/0320928 | A1 * | 12/2010 | Kaihotsu ............ H01L 25/0753 315/250 |
| 2011/0018017 | A1 | 1/2011 | Bierhuizen et al. |
| 2011/0031516 | A1 | 2/2011 | Basin et al. |
| 2011/0049545 | A1 | 3/2011 | Basin et al. |
| 2011/0068702 | A1 | 3/2011 | van de Ven et al. |
| 2011/0169033 | A1 * | 7/2011 | Fukunaga ............... H01L 33/52 257/98 |
| 2011/0180822 | A1 | 7/2011 | Ruhnau et al. |
| 2011/0254022 | A1 | 10/2011 | Sasano |

(56) References Cited

U.S. PATENT DOCUMENTS

| | | |
|---|---|---|
| 2011/0309388 A1 | 12/2011 | Ito et al. |
| 2012/0061692 A1 | 3/2012 | Chang et al. |
| 2012/0086023 A1* | 4/2012 | Veerasamy ............ C03C 17/009 257/88 |
| 2012/0104452 A1* | 5/2012 | Miyoshi .............. H01L 25/0753 257/99 |
| 2012/0107622 A1 | 5/2012 | Borrelli et al. |
| 2012/0111471 A1 | 5/2012 | Negley et al. |
| 2012/0193651 A1 | 8/2012 | Edmond et al. |
| 2012/0305949 A1* | 12/2012 | Donofrio ............ H01L 25/0753 257/88 |
| 2012/0306355 A1 | 12/2012 | Seibel, II |
| 2013/0033169 A1 | 2/2013 | Ito et al. |
| 2013/0057593 A1 | 3/2013 | Morishita |
| 2013/0069781 A1 | 3/2013 | Terwilliger et al. |
| 2013/0077299 A1 | 3/2013 | Hussell et al. |
| 2013/0092960 A1* | 4/2013 | Wilcox .................. H01L 33/08 257/88 |
| 2013/0221509 A1 | 8/2013 | Oda et al. |
| 2013/0256710 A1* | 10/2013 | Andrews ............ H01L 25/0753 257/88 |
| 2013/0256711 A1 | 10/2013 | Joo et al. |
| 2013/0264589 A1 | 10/2013 | Bergmann et al. |
| 2013/0271991 A1 | 10/2013 | Hussell et al. |
| 2013/0301257 A1 | 11/2013 | Britt et al. |
| 2014/0138725 A1 | 5/2014 | Oyamada |
| 2014/0217325 A1 | 8/2014 | Manabe et al. |
| 2014/0217435 A1 | 8/2014 | Bergmann et al. |
| 2014/0217436 A1 | 8/2014 | Hussell et al. |
| 2014/0217443 A1 | 8/2014 | Heikman et al. |
| 2014/0239320 A1 | 8/2014 | Miyoshi et al. |
| 2014/0367713 A1 | 12/2014 | Zhang et al. |
| 2015/0028372 A1* | 1/2015 | Nakanishi ............ H01L 33/486 257/98 |
| 2015/0062915 A1 | 3/2015 | Hussell et al. |
| 2015/0155447 A1 | 6/2015 | Beppu |
| 2015/0204525 A1 | 7/2015 | Shen et al. |
| 2015/0207045 A1 | 7/2015 | Wada et al. |
| 2015/0249196 A1 | 9/2015 | Williams et al. |
| 2015/0257211 A1 | 9/2015 | Johnson et al. |
| 2015/0262987 A1 | 9/2015 | Wada et al. |
| 2015/0263247 A1 | 9/2015 | Wada et al. |
| 2015/0349218 A1 | 12/2015 | Reiherzer et al. |
| 2015/0364660 A1 | 12/2015 | Huang et al. |
| 2016/0064623 A1 | 3/2016 | Clatterbuck |
| 2016/0074833 A1 | 3/2016 | O'Brien et al. |
| 2016/0079486 A1 | 3/2016 | Sugimoto et al. |
| 2016/0093777 A1* | 3/2016 | Sato ...................... H01L 25/167 257/98 |
| 2016/0111600 A1 | 4/2016 | Chae et al. |
| 2016/0126010 A1* | 5/2016 | Wang .................. H05K 1/0283 315/185 R |
| 2016/0126434 A1 | 5/2016 | Nakabayashi |
| 2016/0161098 A1 | 6/2016 | Tudorica et al. |
| 2016/0293811 A1 | 10/2016 | Hussell et al. |
| 2016/0351846 A1* | 12/2016 | Kim .................... H01L 51/5212 |
| 2017/0040183 A1 | 2/2017 | Sakai et al. |
| 2017/0092820 A1 | 3/2017 | Kim et al. |
| 2017/0098746 A1 | 4/2017 | Bergmann et al. |
| 2017/0154880 A1* | 6/2017 | Ozeki .................... H01L 33/58 |
| 2017/0263828 A1 | 9/2017 | Mao et al. |
| 2017/0294417 A1 | 10/2017 | Edmond et al. |
| 2017/0299798 A1 | 10/2017 | Son |
| 2017/0301832 A1 | 10/2017 | Basin et al. |
| 2017/0358624 A1 | 12/2017 | Takeya et al. |
| 2017/0373225 A1 | 12/2017 | Shichijo et al. |
| 2018/0012949 A1 | 1/2018 | Takeya et al. |
| 2018/0033924 A1 | 2/2018 | Andrews et al. |
| 2018/0043178 A1 | 2/2018 | Iguchi et al. |
| 2018/0069164 A1 | 3/2018 | Minato et al. |
| 2018/0076368 A1 | 3/2018 | Hussell |
| 2018/0102348 A1 | 4/2018 | Haiberger et al. |
| 2018/0102449 A1 | 4/2018 | Pschenitzka et al. |
| 2018/0103513 A1* | 4/2018 | Tseng ..................... H01L 33/36 |
| 2018/0130776 A1 | 5/2018 | Oka |
| 2018/0190880 A1 | 7/2018 | Vampola et al. |
| 2018/0190881 A1 | 7/2018 | Lin |
| 2018/0190885 A1* | 7/2018 | Chang ..................... H01L 33/58 |
| 2019/0122592 A1 | 4/2019 | Han et al. |
| 2019/0148346 A1 | 5/2019 | Feichtinger et al. |
| 2019/0165231 A1 | 5/2019 | Doan et al. |
| 2019/0312187 A1 | 10/2019 | Harada et al. |
| 2020/0152840 A1 | 5/2020 | Hussell |

FOREIGN PATENT DOCUMENTS

| | | |
|---|---|---|
| CN | 204088306 U | 1/2015 |
| EP | 1710846 A1 | 10/2006 |
| EP | 2216834 A1 | 8/2010 |
| EP | 2768037 A1 | 9/2012 |
| EP | 2804225 A1 | 11/2014 |
| EP | 2819191 A1 | 12/2014 |
| EP | 2927970 A1 | 10/2015 |
| WO | 2007034367 A1 | 3/2007 |
| WO | 2011007275 A1 | 1/2011 |
| WO | 2012058040 A1 | 5/2012 |
| WO | 2013154818 A1 | 10/2013 |
| WO | 2014024108 A1 | 2/2014 |
| WO | 2014133294 A1 | 9/2014 |
| WO | 2014159894 A1 | 10/2014 |
| WO | 2015026033 A1 | 2/2015 |
| WO | 2018022456 A1 | 2/2018 |

OTHER PUBLICATIONS

Nichia Corporation, "NC2W321AT: Specifications for White LED," NICHIA STS-DA1-4323A <Cat. No. 160711>, [online], [retrieved on May 21, 2018] Retrieved from Nichia Corporation using Internet <URL: http://www.nichia.co.jp/en/product/led.html>, 16 pages.

Nichia Corporation, "NC4W321AT: Specifications for White LED," NICHIA STS-DA1-4325A <Cat. No. 160711>, [online], [retrieved on May 21, 2018] Retrieved from Nichia Corporation using Internet <URL: http://www.nichia.co.jp/en/product/led.html>, 16 pages.

International Search Report and Written Opinion for International Patent Application No. PCT/US2017/043316, dated Sep. 1, 2017, 13 pages.

Non-Final Office Action for U.S. Appl. No. 15/657,027, dated Apr. 10, 2018, 11 pages.

Final Office Action for U.S. Appl. No. 15/657,027, dated Oct. 19, 2018, 17 pages.

International Preliminary Report on Patentability for International Patent Application No. PCT/US2017/043316, dated Feb. 7, 2019, 9 pages.

Notice of Allowance for U.S. Appl. No. 15/657,027, dated Dec. 28, 2018, 9 pages.

Dupont, "DuPont™ Ti-Pure® titanium dioxide: Titanium Dioxide for Coatings," Product Brochure H-65969-2, Jun. 2007, 28 pages.

Restriction Requirement for U.S. Appl. No. 29/661,900, dated Nov. 25, 2019, 6 pages.

Notice of Allowance for U.S. Appl. No. 16/380,400, dated Nov. 27, 2019, 8 pages.

Invitation to Pay Additional Fees and Partial International Search for International Patent Application No. PCT/US2019/028704, dated Jul. 17, 2019, 14 pages.

International Search Report and Written Opinion for International Patent Application No. PCT/US2019/028704, dated Sep. 9, 2019, 18 pages.

Invitation to Pay Additional Fees and Partial International Search for International Patent Application No. PCT/US2019/028708, dated Jul. 17, 2019, 17 pages.

International Search Report and Written Opinion for International Patent Application No. PCT/US2019/028708, dated Sep. 9, 2019, 20 pages.

Non-Final Office Action for U.S. Appl. No. 16/380,400, dated Sep. 9, 2019, 13 pages.

Author Unknown, "Black Silicon," Wikipedia [online], <https://web.archive.org/web/20150401161824/http://en.wikipedia.org/wiki/Black_Silicon> Apr. 1, 2015, 1 page.

(56) References Cited

OTHER PUBLICATIONS

Final Office Action for U.S. Appl. No. 16/118,747, dated Jun. 9, 2020, 43 pages.
Final Office Action for U.S. Appl. No. 16/118,779, dated Jul. 16, 2020, 35 pages.
Non-Final Office Action for U.S. Appl. No. 16/545,357, dated Jun. 24, 2020, 33 pages.
Notice of Allowance for U.S. Appl. No. 16/797,173, dated Jun. 22, 2020, 10 pages.
Examination Report for European Patent Application No. 17748998.6, dated Jun. 25, 2020, 7 pages.
International Search Report and Written Opinion for International Patent Application No. PCT/US2020/038960, dated Aug. 11, 2020, 17 pages.
Advisory Action for U.S. Appl. No. 16/118,747, dated Aug. 18, 2020, 3 pages.
Advisory Action and Applicant-Initiated Interview Summary for U.S. Appl. No. 16/118,747, dated Aug. 24, 2020, 5 pages.
Non-Final Office Action for U.S. Appl. No. 16/118,747, dated Sep. 8, 2020, 32 pages.
Non-Final Office Action for U.S. Appl. No. 16/380,400, dated Jul. 27, 2020, 12 pages.
Notice of Allowance for U.S. Appl. No. 16/797,173, dated Aug. 24, 2020, 9 pages.
Non-Final Office Action for U.S. Appl. No. 16/118,747, dated Jan. 29, 2020, 28 pages.
Notice of Allowance for U.S. Appl. No. 29/661,900, dated Apr. 29, 2020, 6 pages.
Non-Final Office Action for U.S. Appl. No. 16/118,779, dated Jan. 10, 2020, 27 pages.
Notice of Allowance for U.S. Appl. No. 16/380,400, dated Mar. 17, 2020, 8 pages.
Examination Report for European Patent Application No. 17748998.6, dated Jan. 3, 2020, 7 pages.
Advisory Action and Applicant-Initiated Interview Summary for U.S. Appl. No. 16/118,779, dated Nov. 20, 2020, 5 pages.
Final Office Action for U.S. Appl. No. 16/545,357, dated Dec. 7, 2020, 41 pages.
Notice of Allowance for U.S. Appl. No. 16/380,400, dated Oct. 28, 2020, 9 pages.
Non-Final Office Action for U.S. Appl. No. 16/453,447, dated Dec. 22, 2020, 19 pages.
International Preliminary Report on Patentability for International Patent Application No. PCT/US2019/028704, dated Dec. 10, 2020, 11 pages.
International Preliminary Report on Patentability for International Patent Application No. PCT/US2019/028708, dated Dec. 10, 2020, 12 pages.
Non-Final Office Action for U.S. Appl. No. 16/545,357, dated Mar. 15, 2021, 28 pages.
Examination Report for European Patent Application No. 17748998.6, dated Feb. 4, 2021, 6 pages.
First Office Action for Chinese Patent Application No. 2017800585182, dated Jan. 27, 2021, 15 pages.
Notice of Allowance for U.S. Appl. No. 16/118,747, dated Jan. 6, 2021, 8 pages.
Non-Final Office Action for U.S. Appl. No. 16/118,779, dated Jan. 22, 2021, 27 pages.
Advisory Action and Applicant-Initiated Interview Summary for U.S. Appl. No. 16/545,357, dated Mar. 3, 2021, 4 pages.
Notice of Allowance for U.S. Appl. No. 16/453,447, dated May 14, 2021, 9 pages.
Corrected Notice of Allowability for U.S. Appl. No. 16/453,447, dated Jun. 23, 2021, 6 pages.
Final Office Action for U.S. Appl. No. 16/118,779, dated Jul. 15, 2021, 25 pages.

* cited by examiner

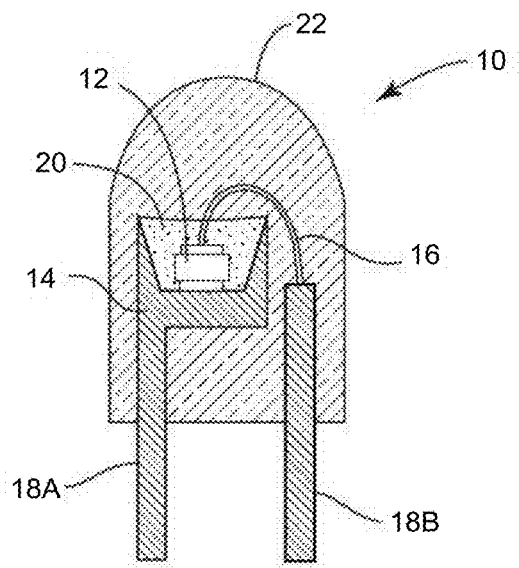
FIG._1
RELATED ART
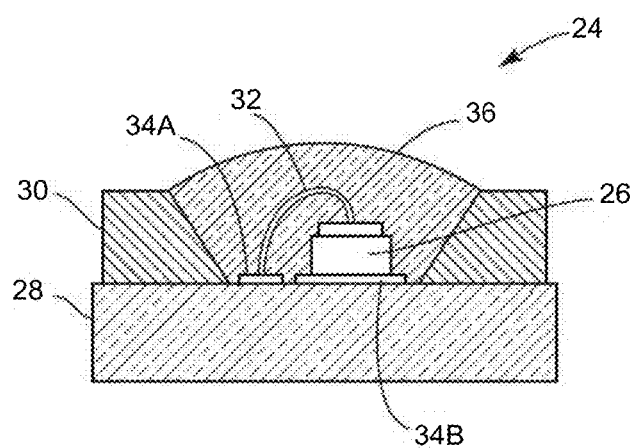
FIG._2
RELATED ART
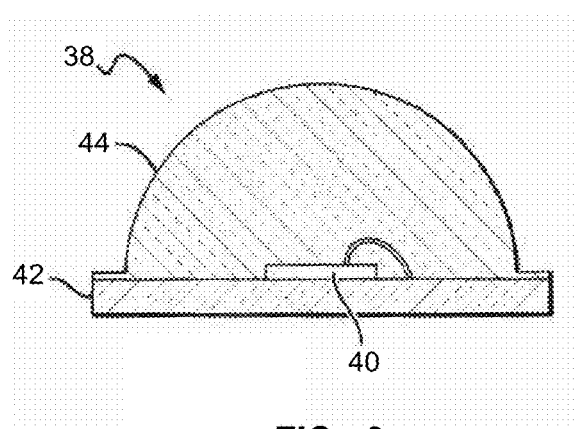
FIG._3
RELATED ART

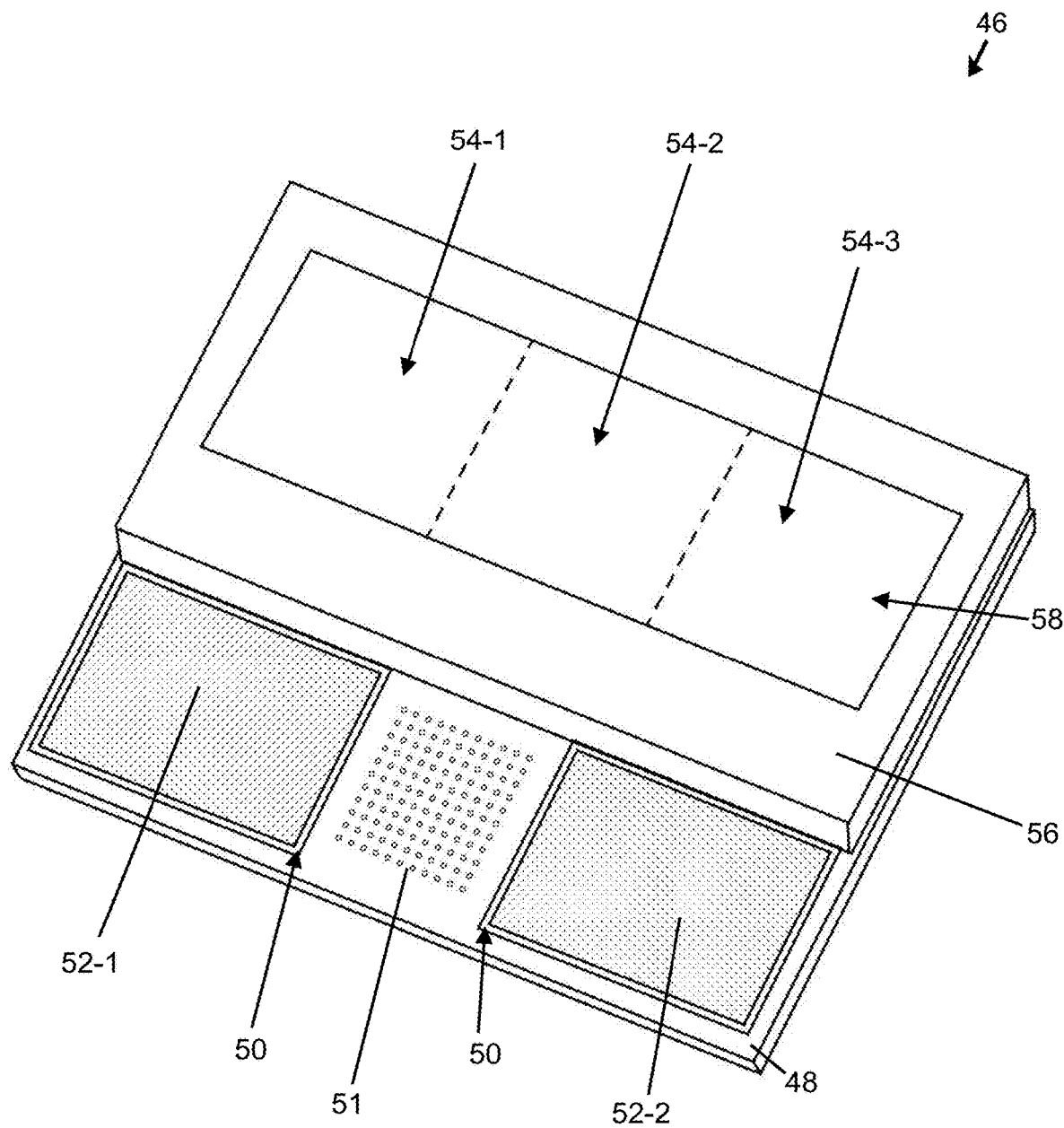
FIG._4

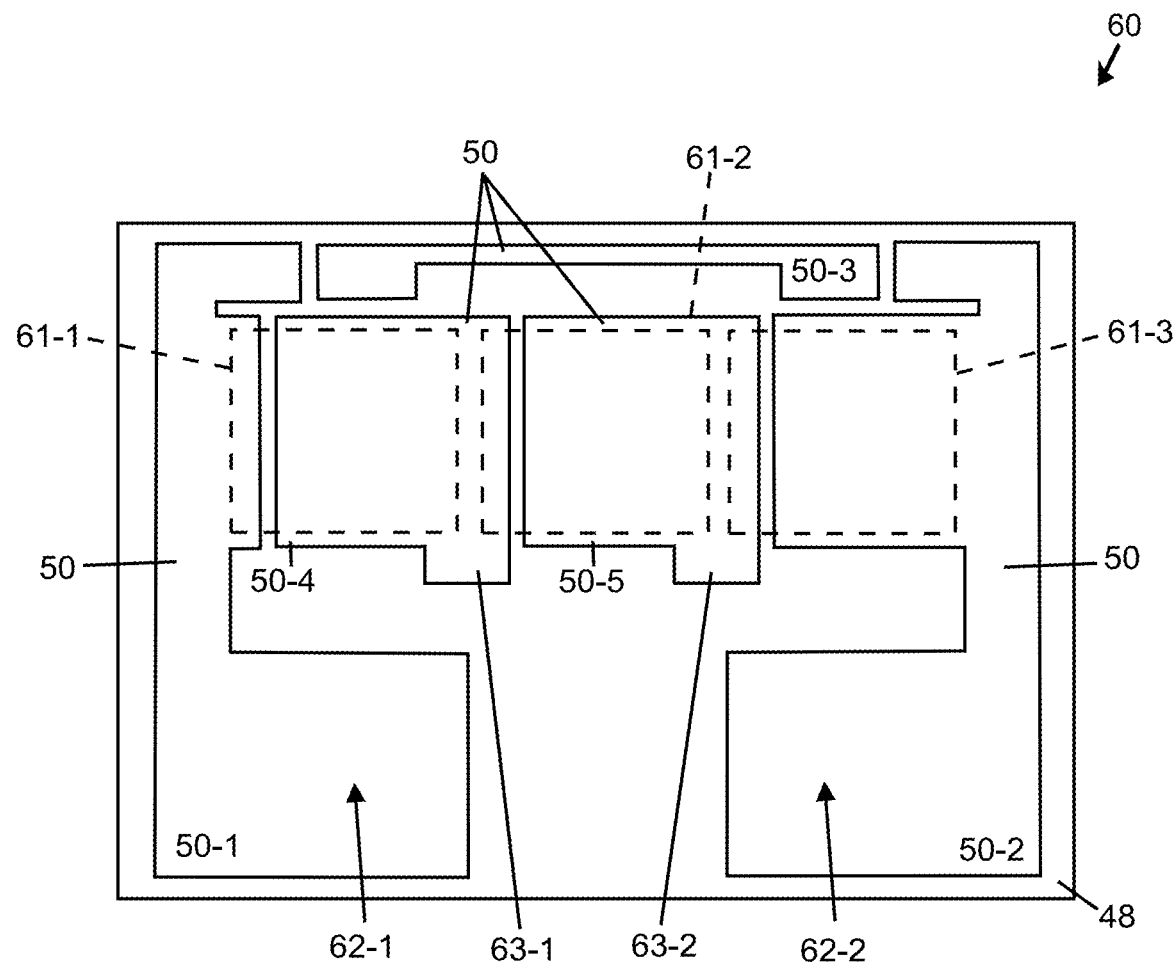
FIG._5A

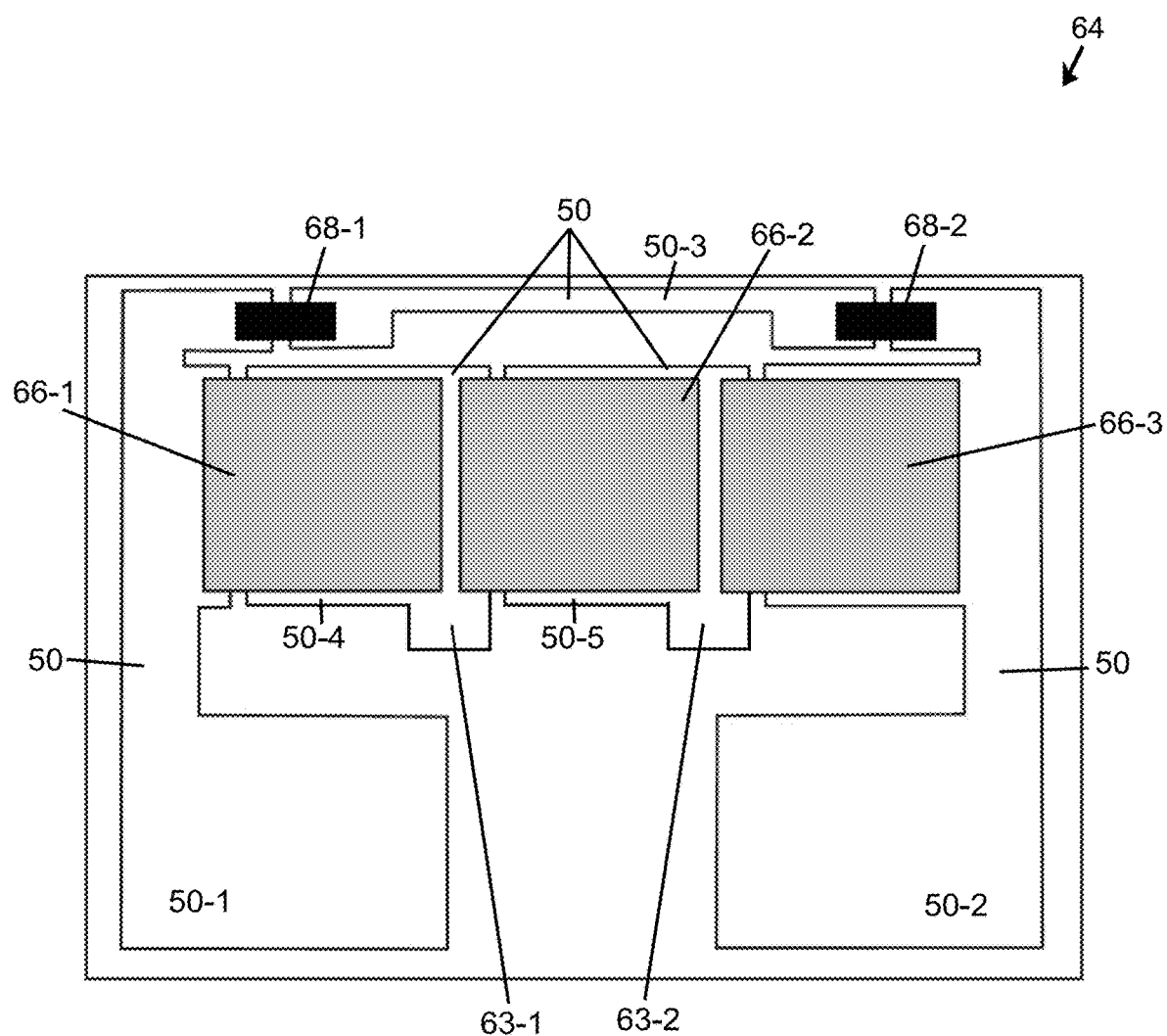
FIG._5B

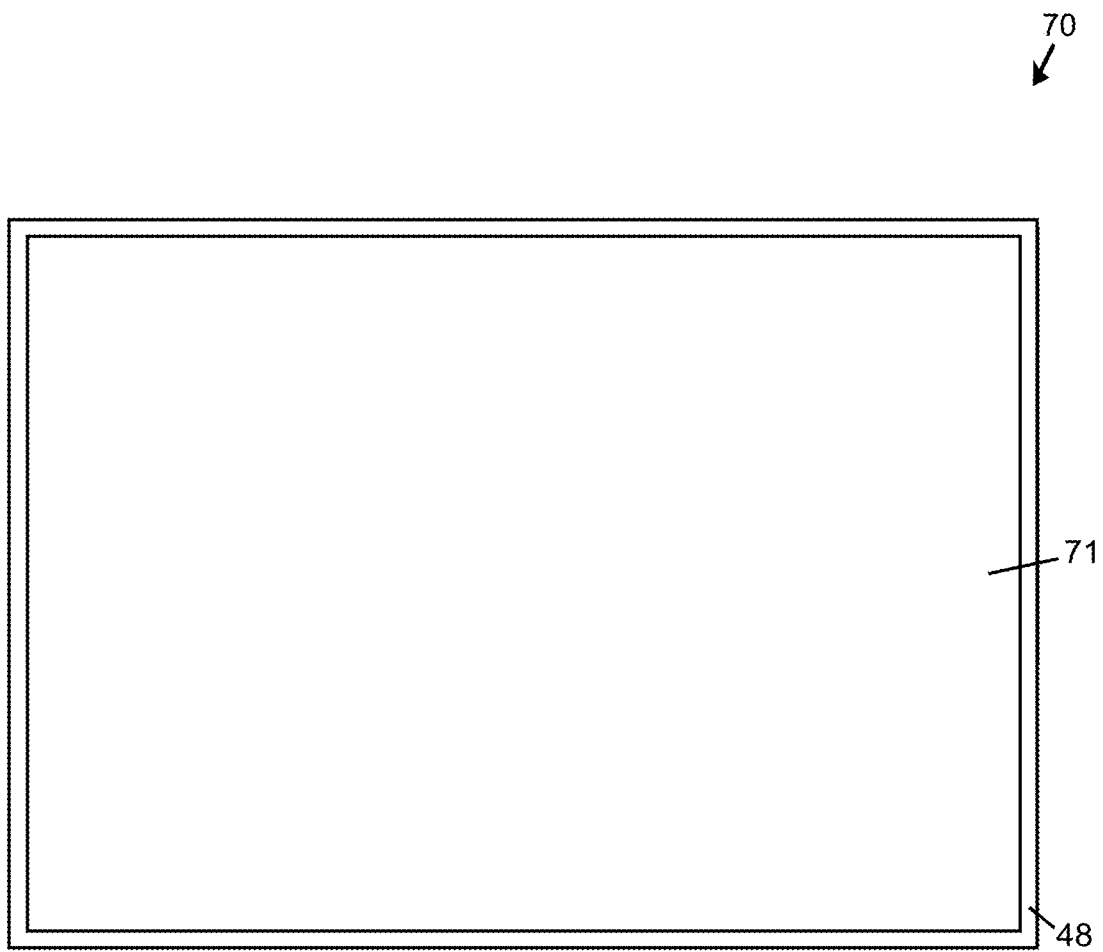
FIG._5D

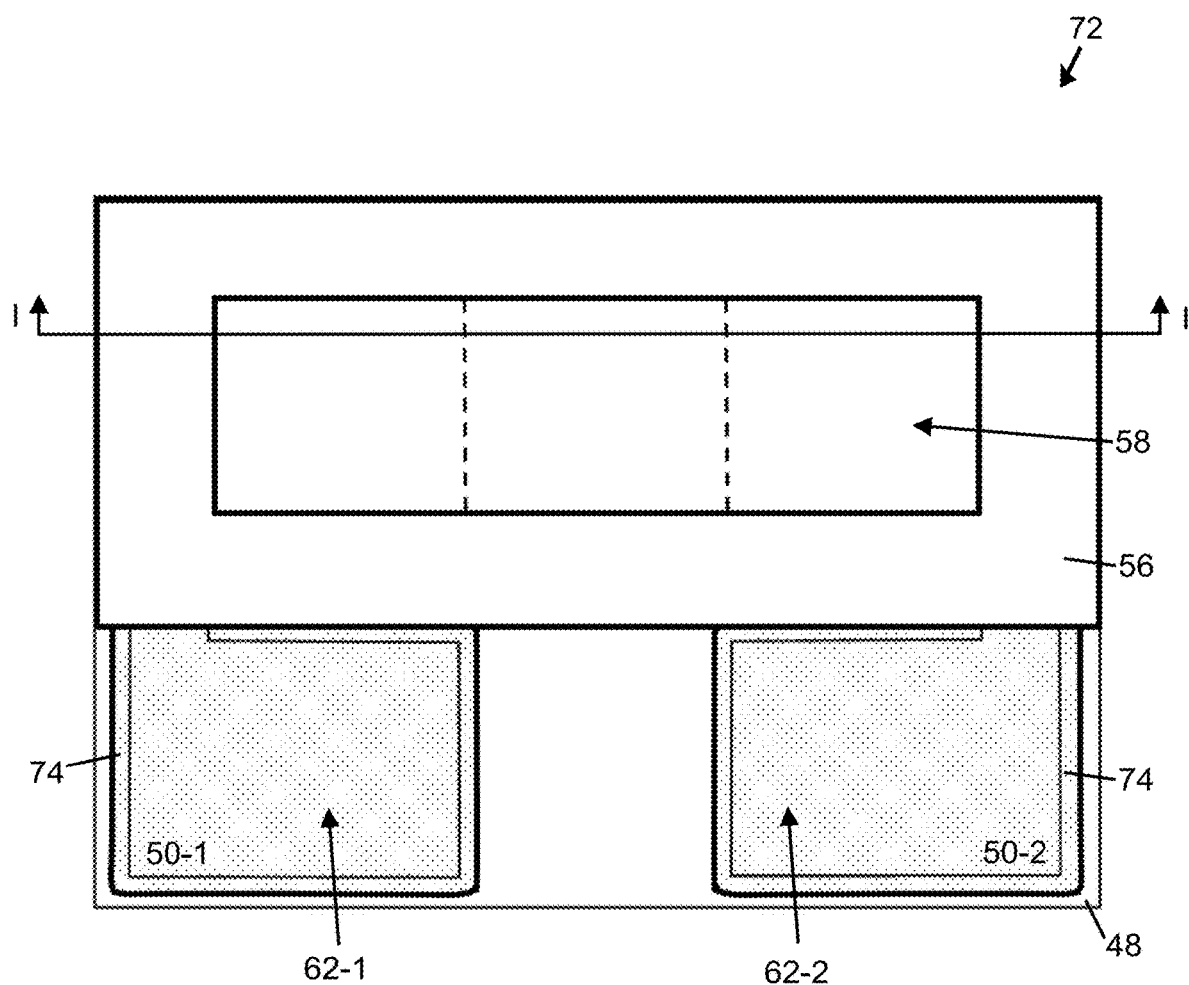
FIG._6A

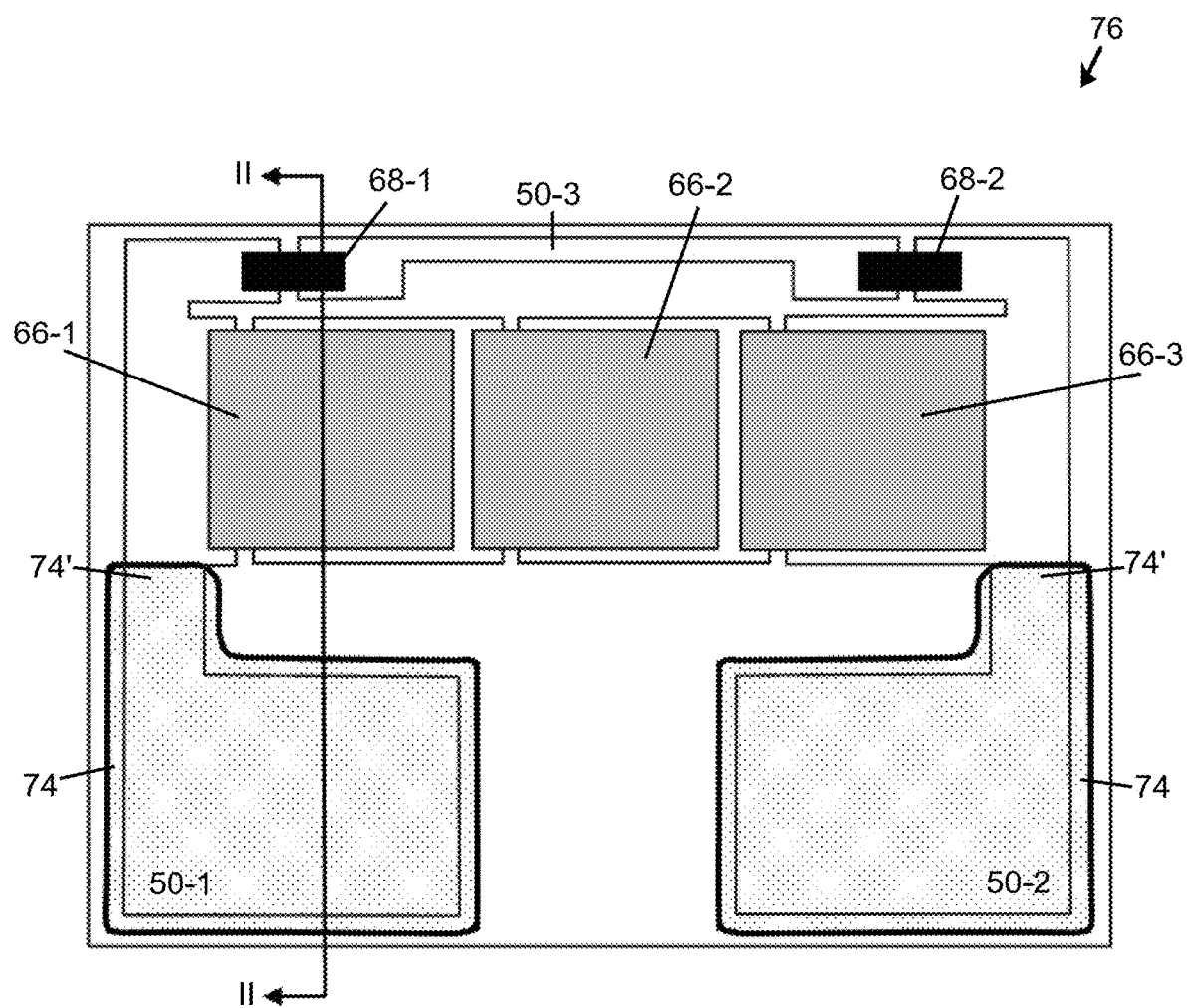
FIG._6B

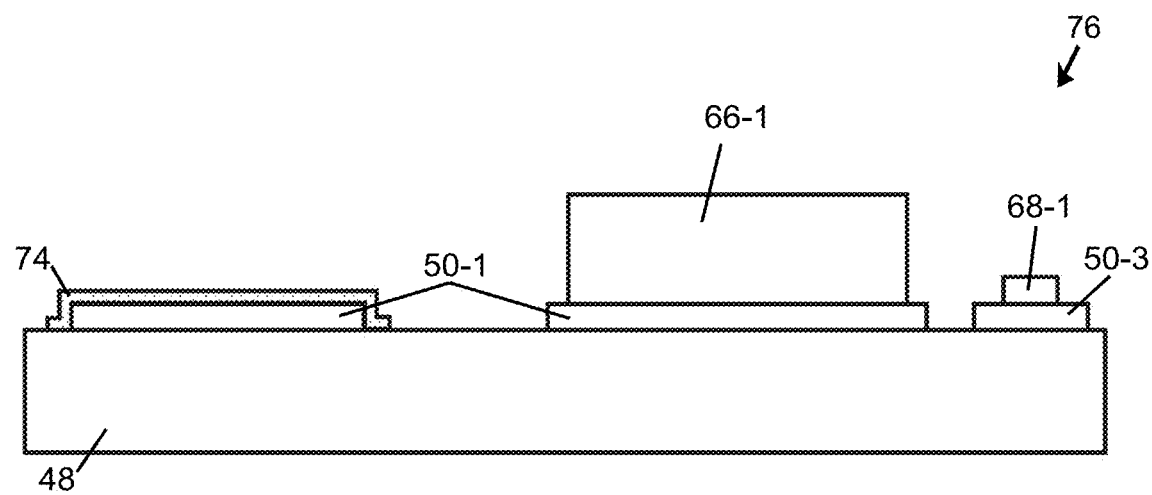
FIG._6C
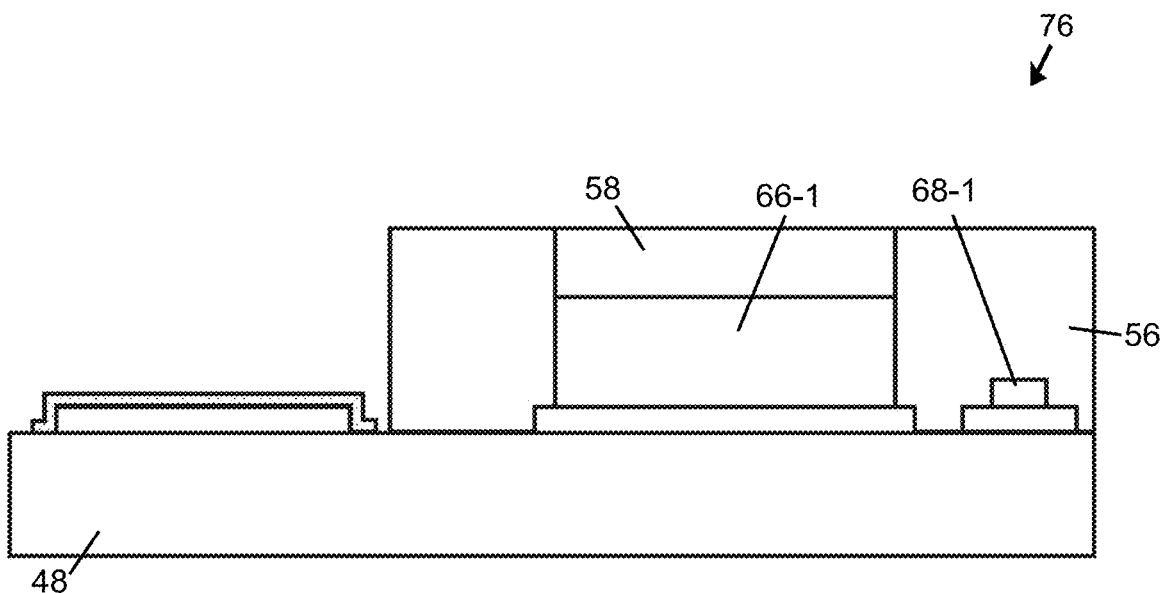
FIG._6D

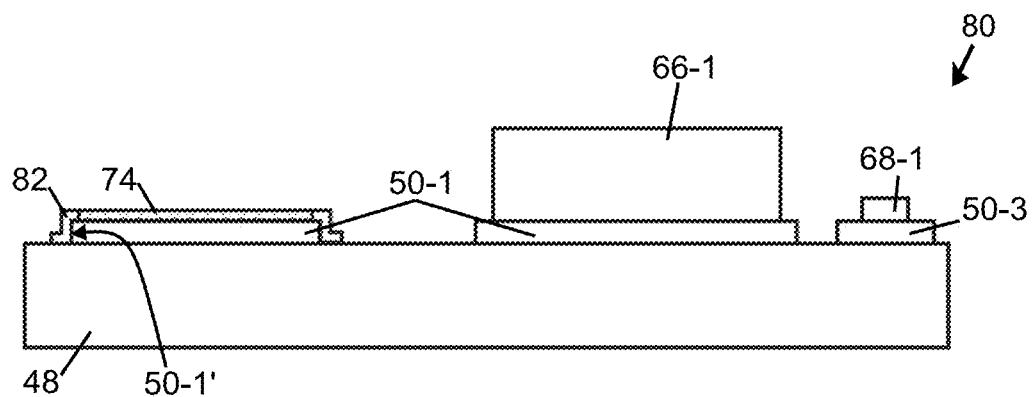
FIG._7A
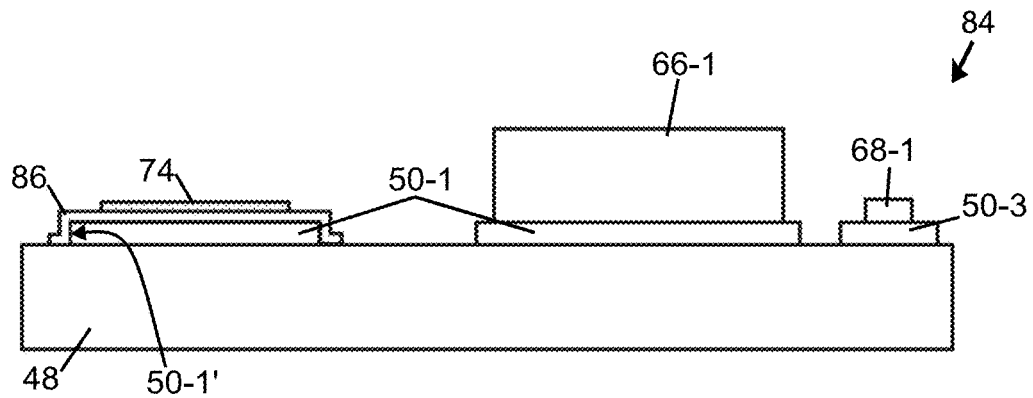
FIG._7B

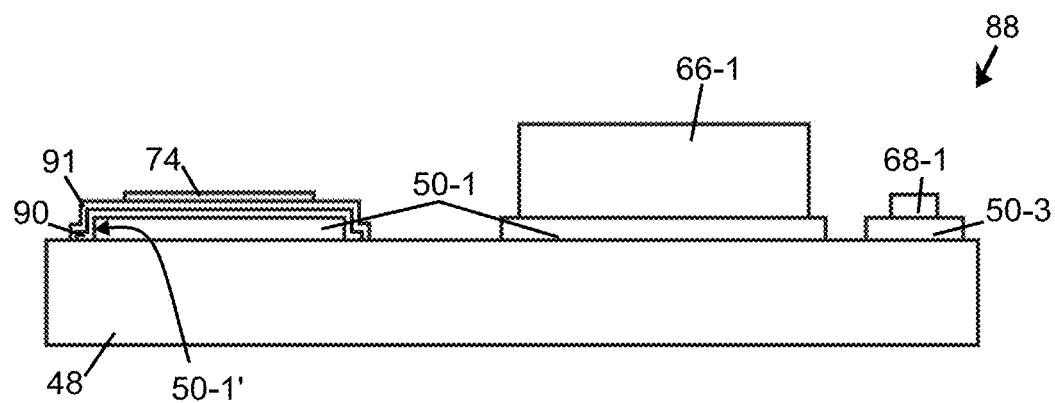
FIG._7C
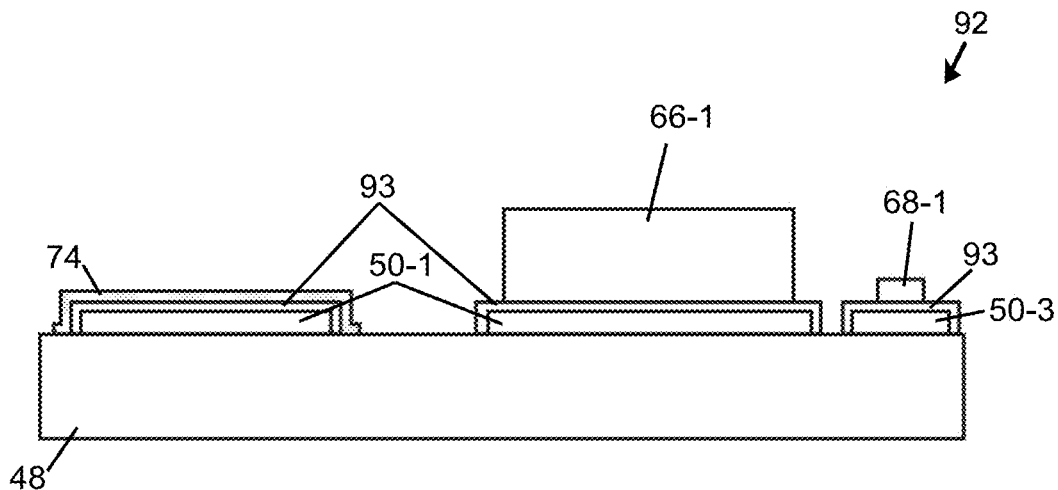
FIG._7D

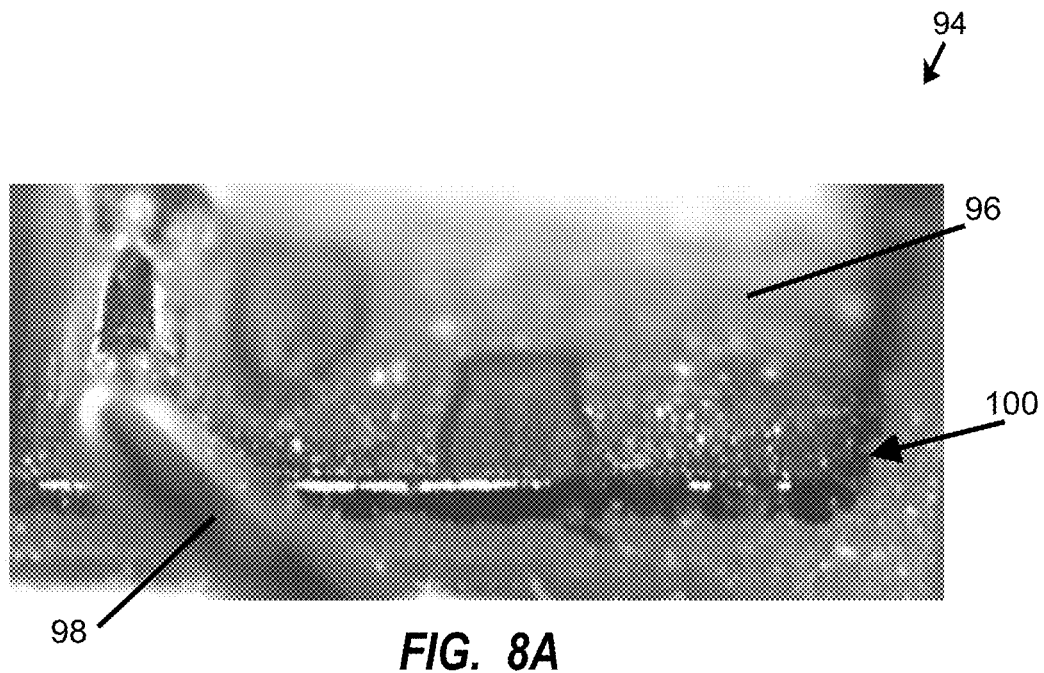
FIG._8A
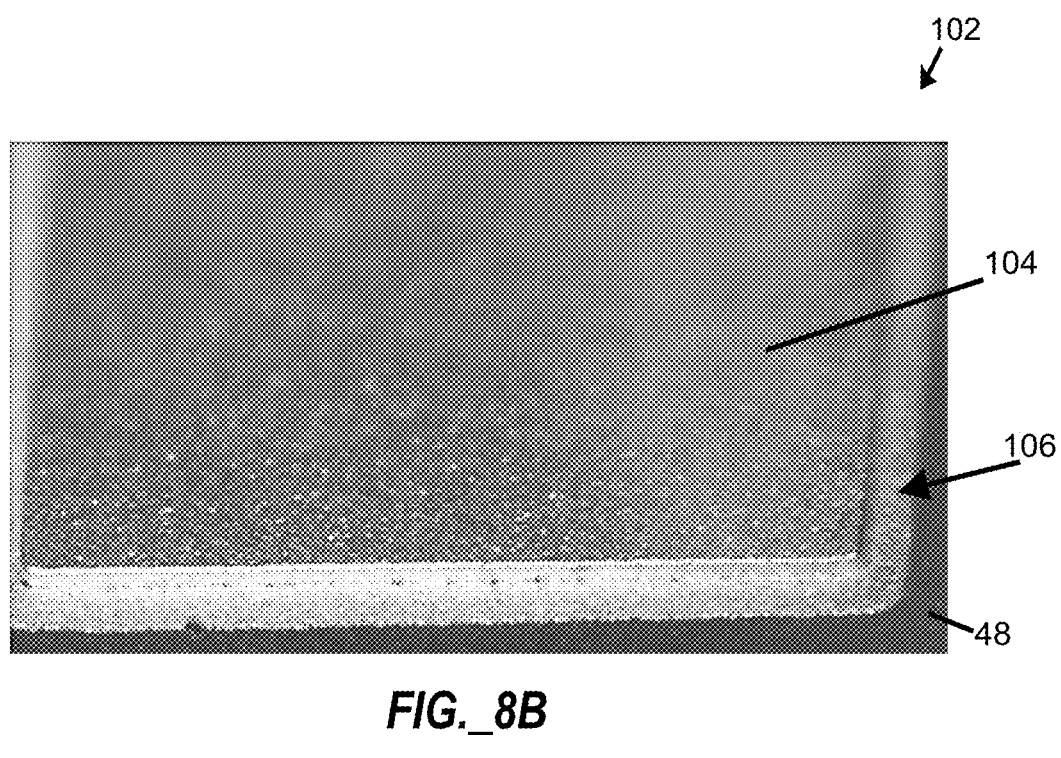
FIG._8B

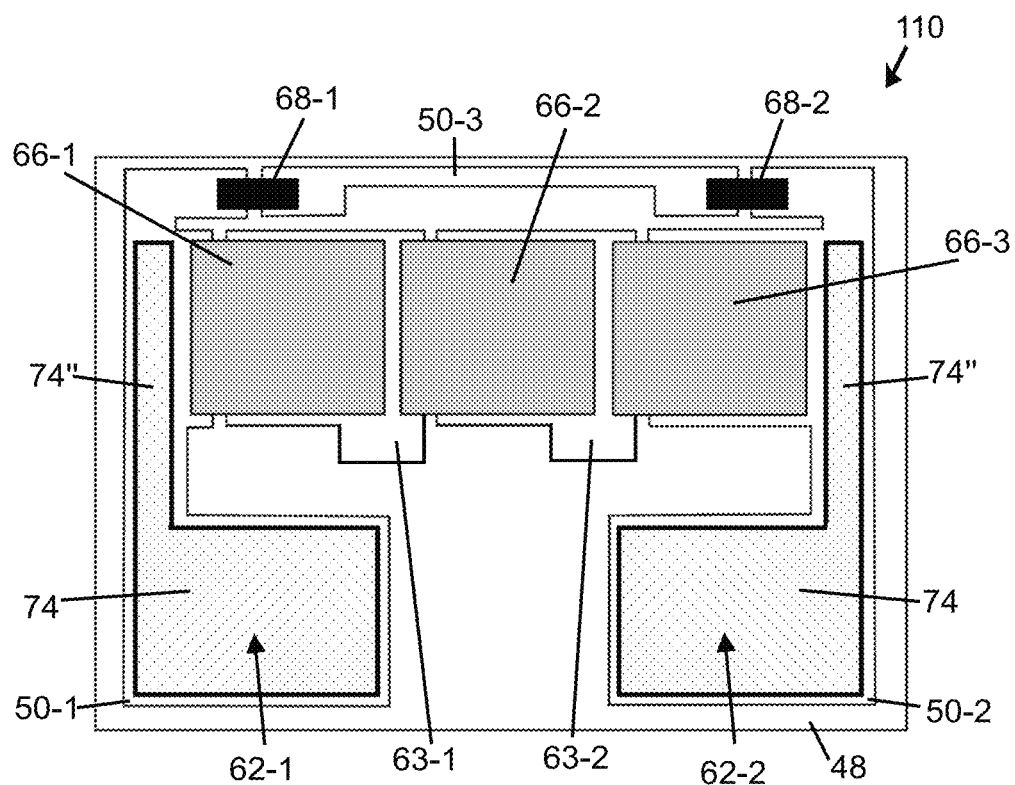
FIG._9
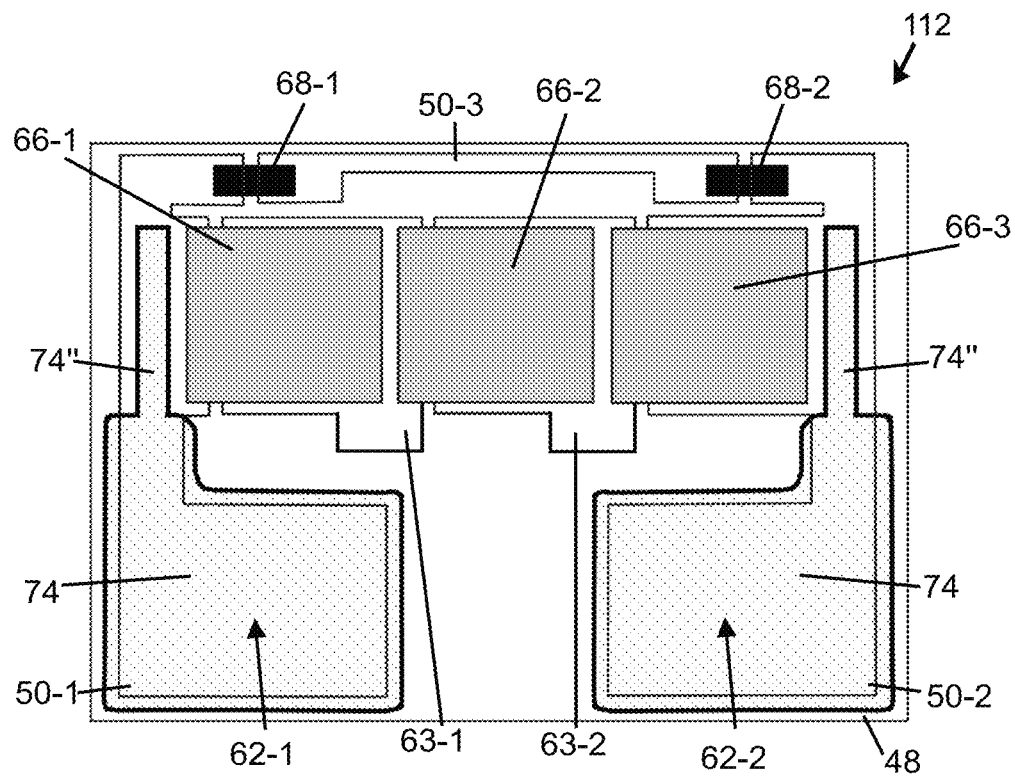
FIG._10

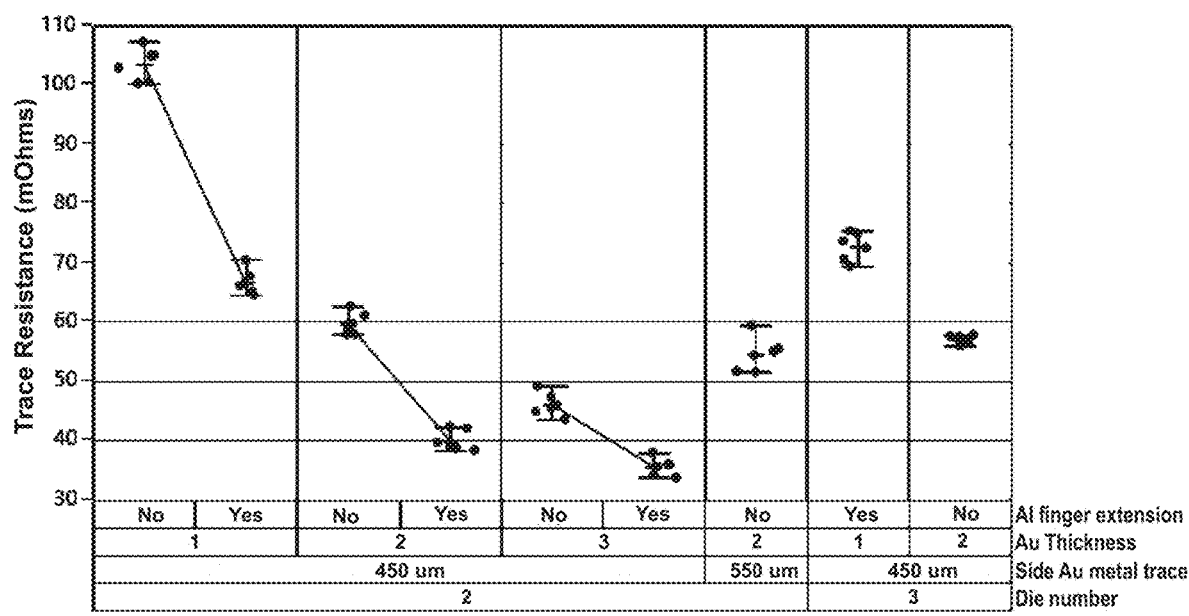
FIG._11A

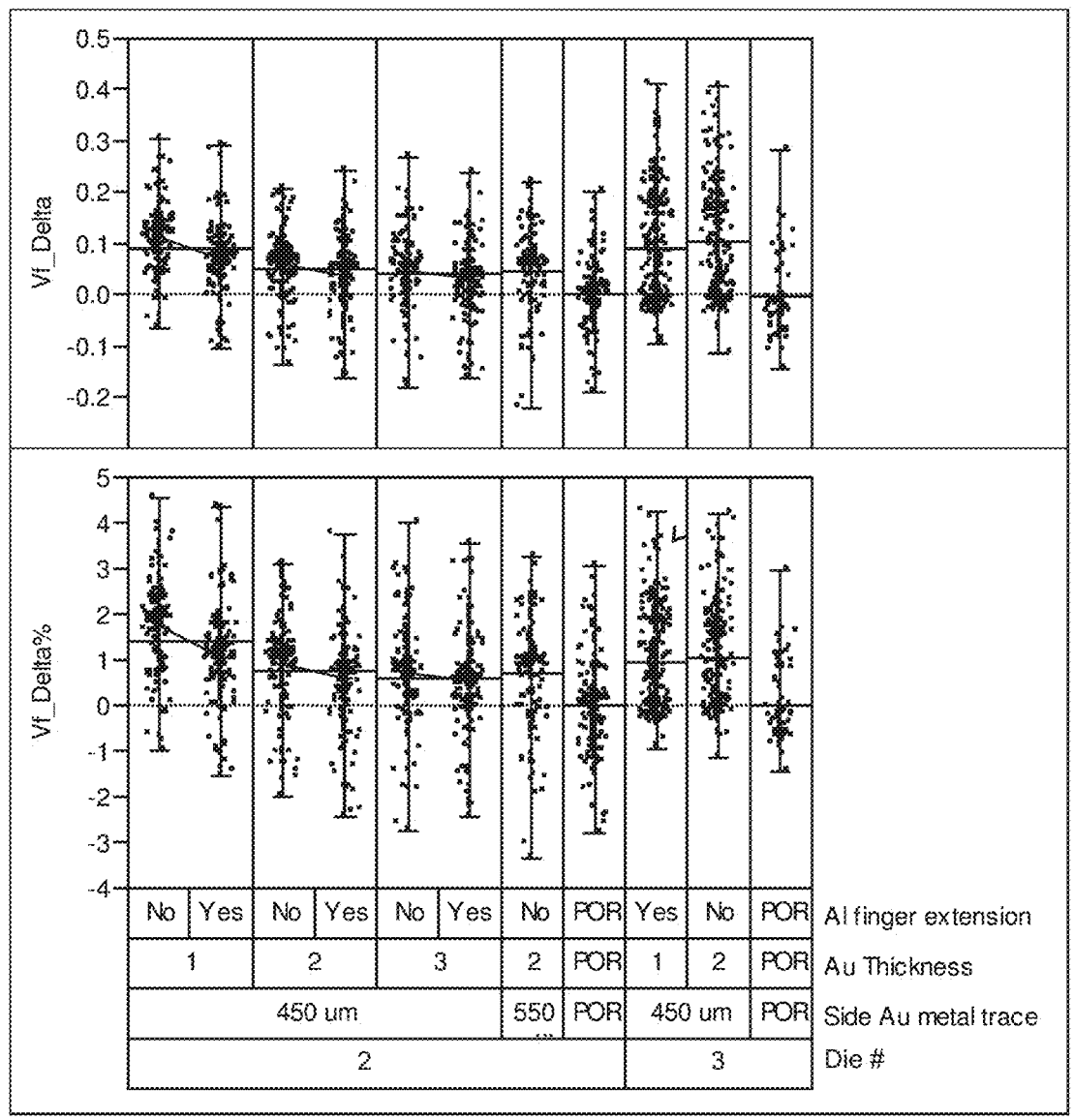
FIG._11B

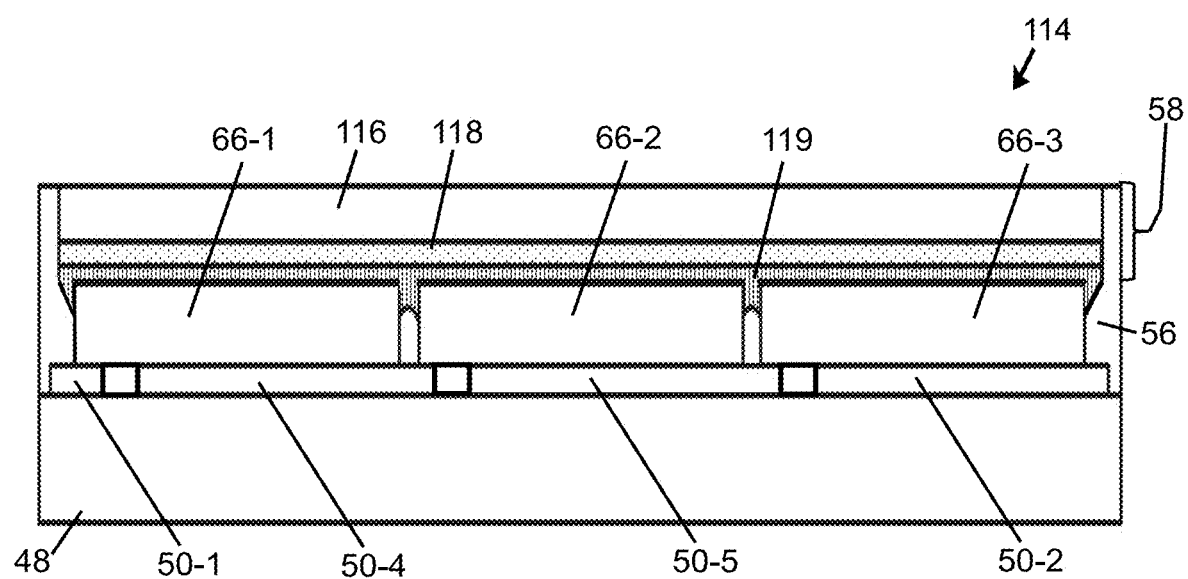
FIG._12A

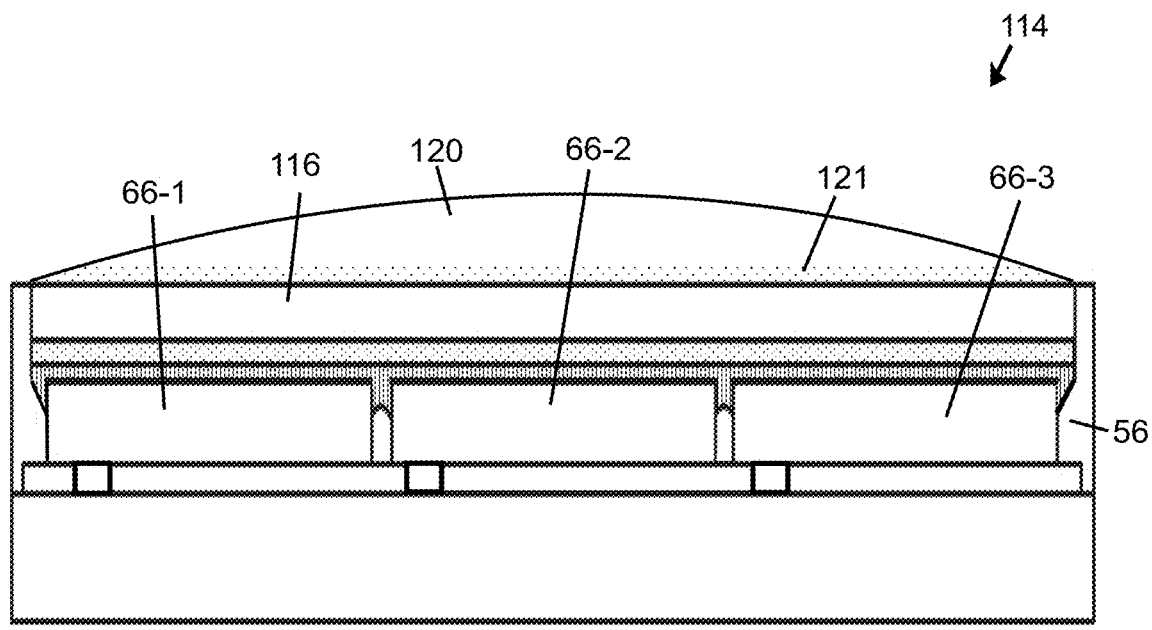
FIG._12B
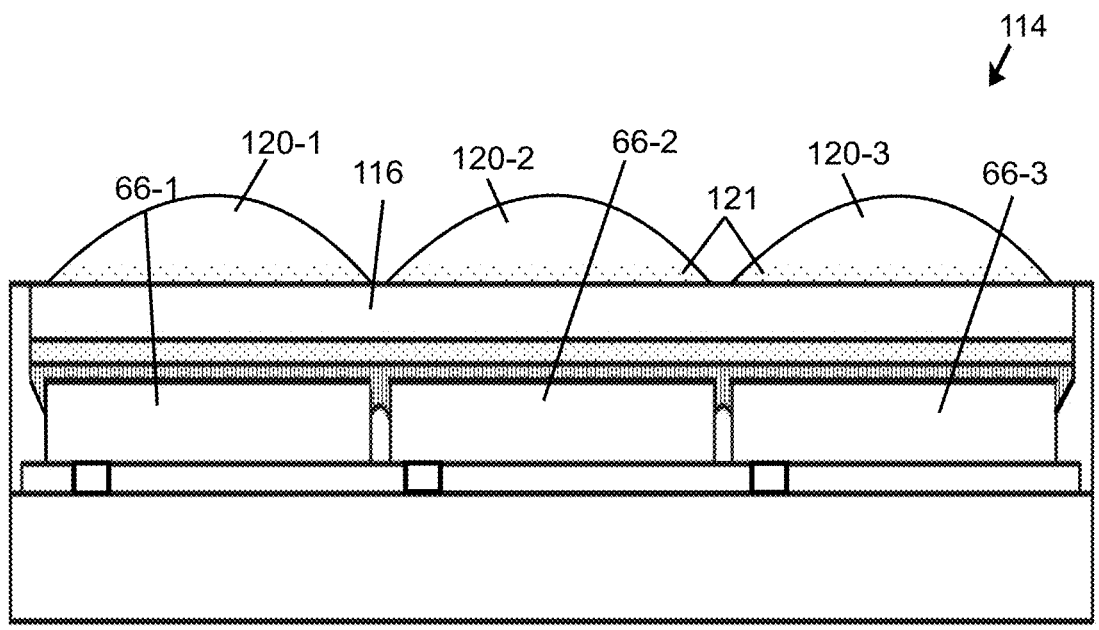
FIG._12C

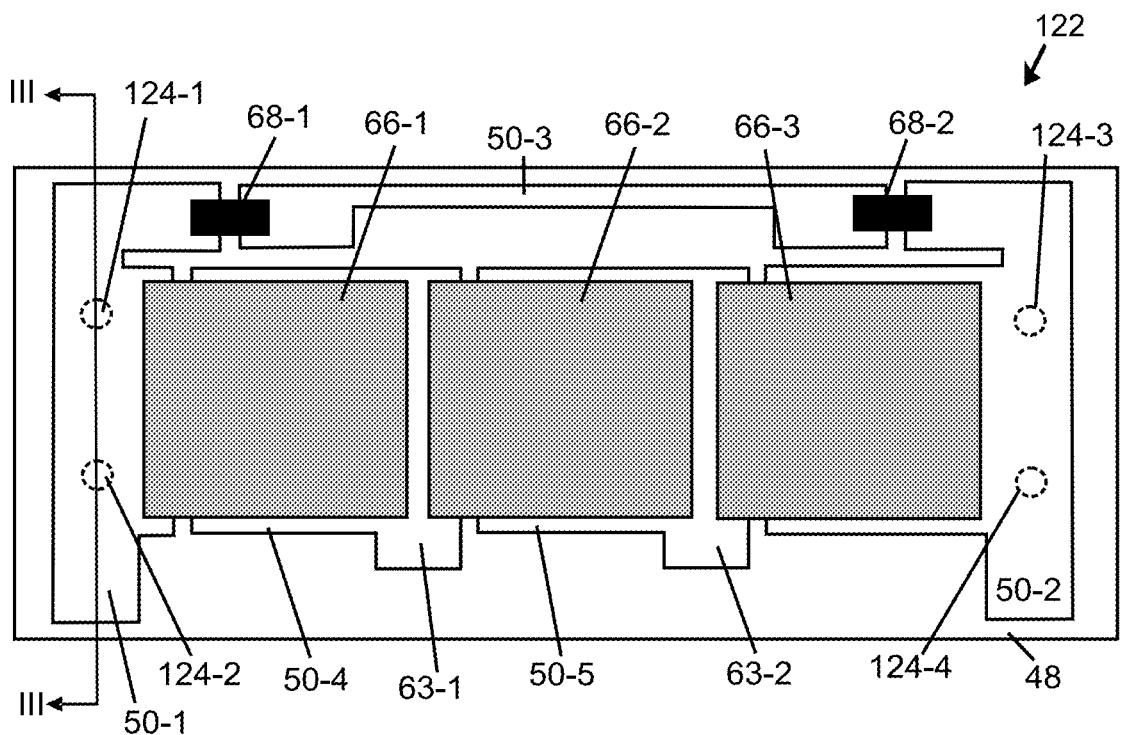
FIG._13A
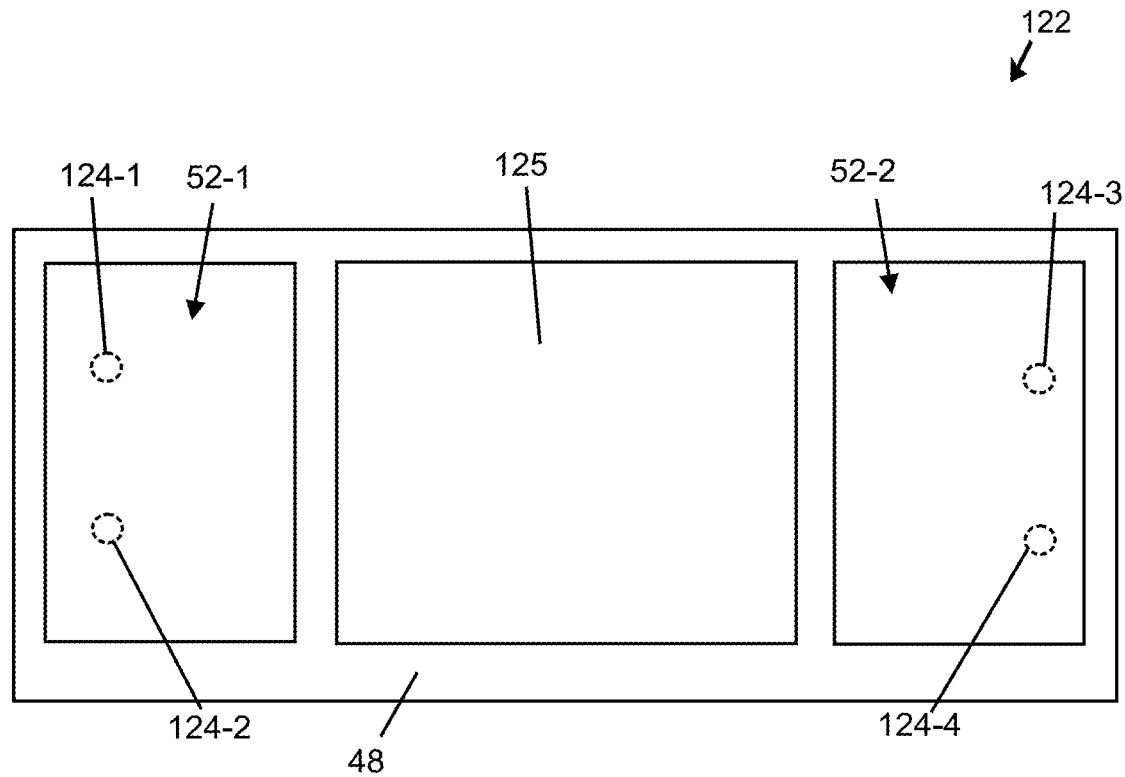
FIG._13B

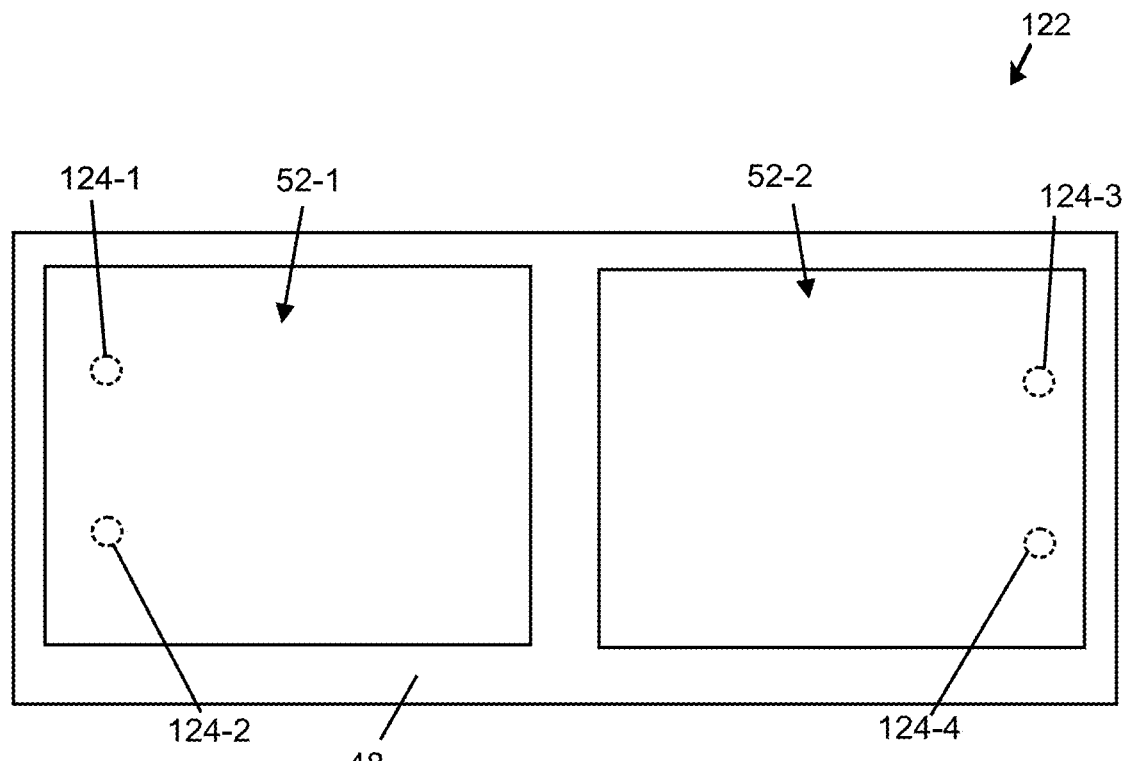
FIG._13C
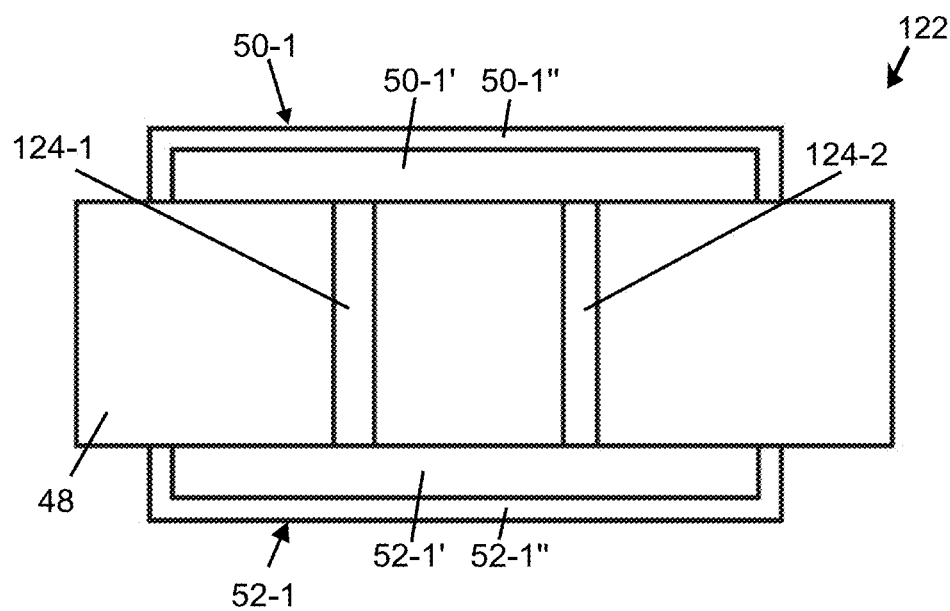
FIG._13D

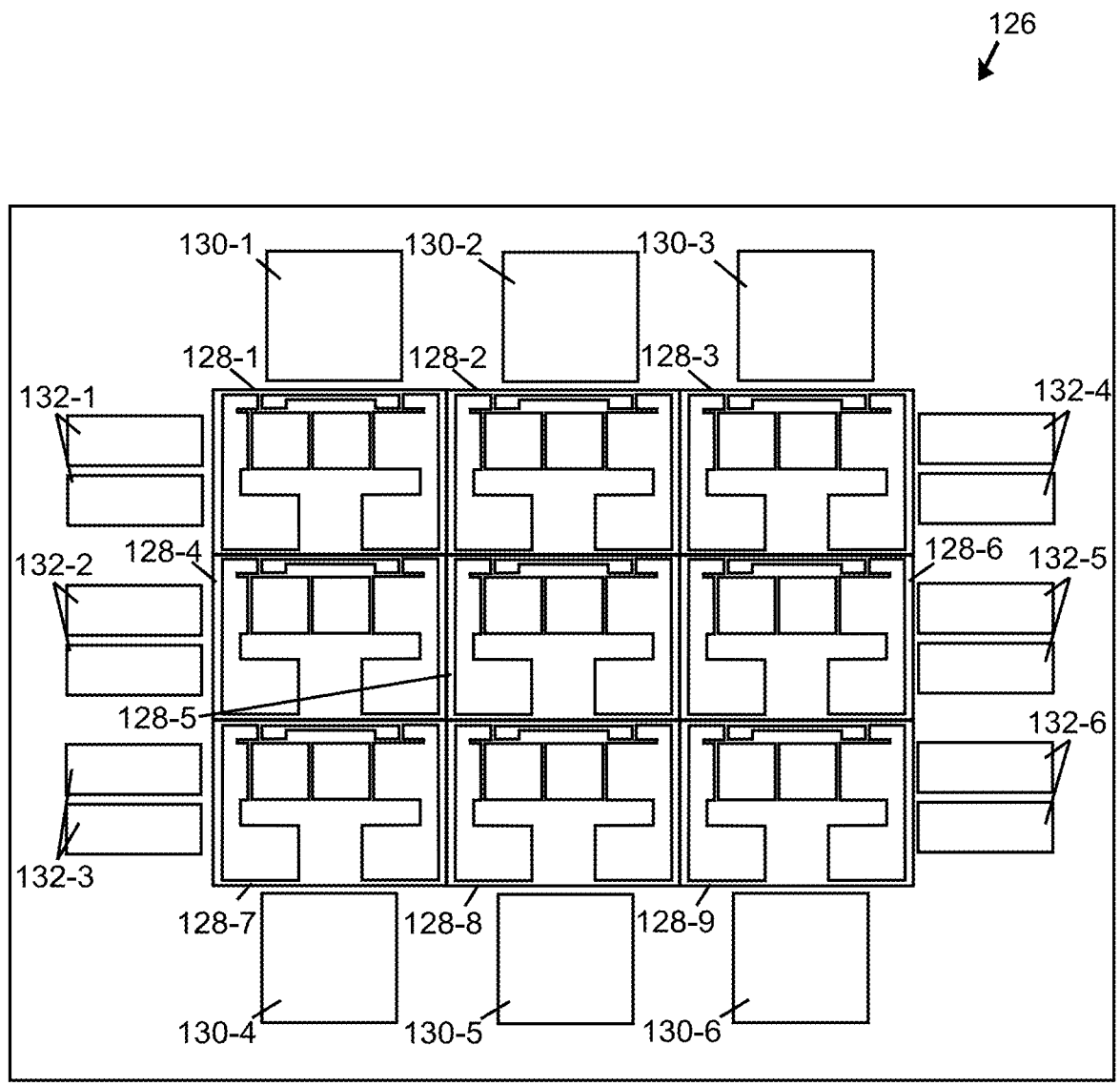
FIG._14

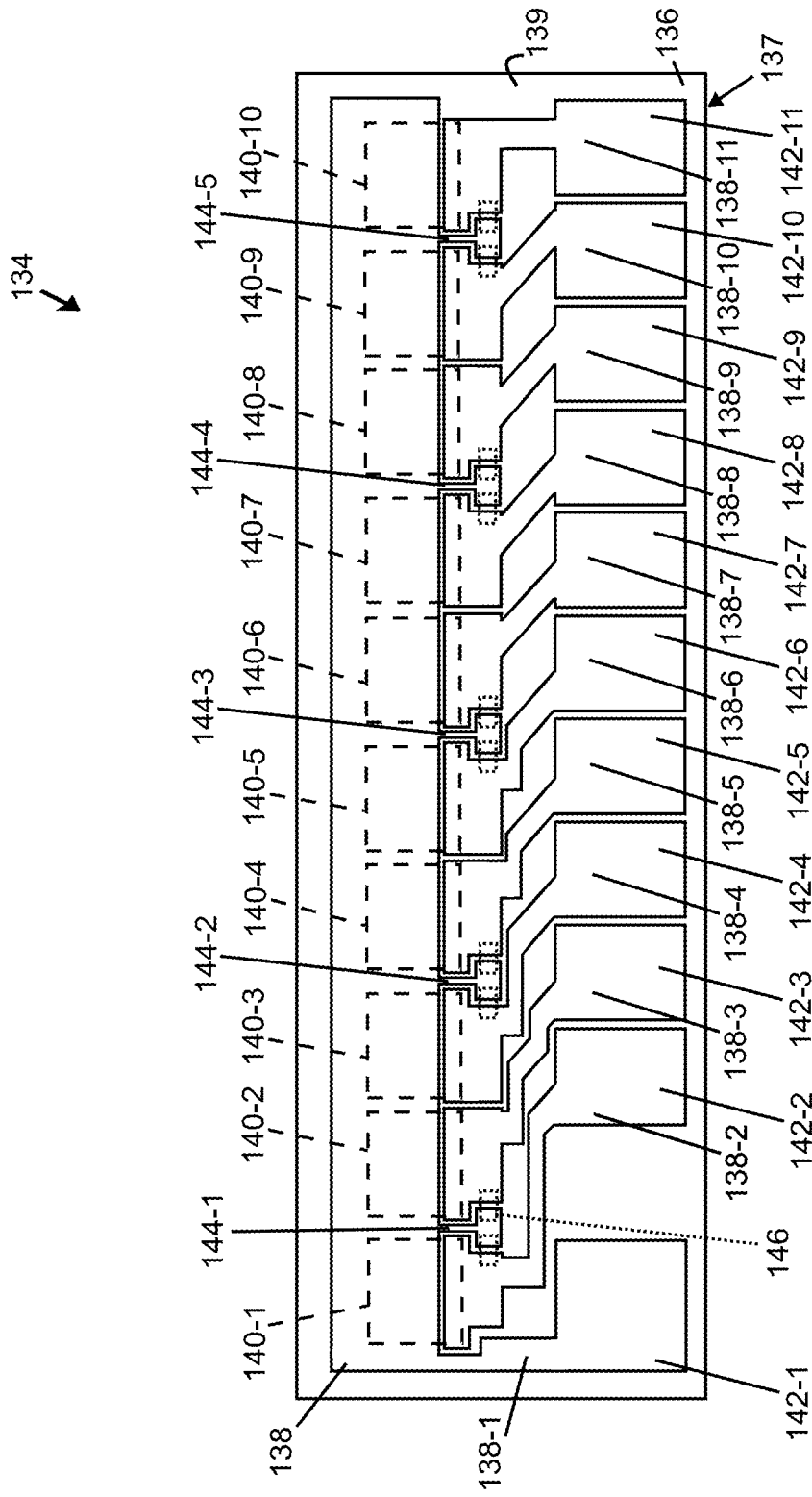
FIG._15A

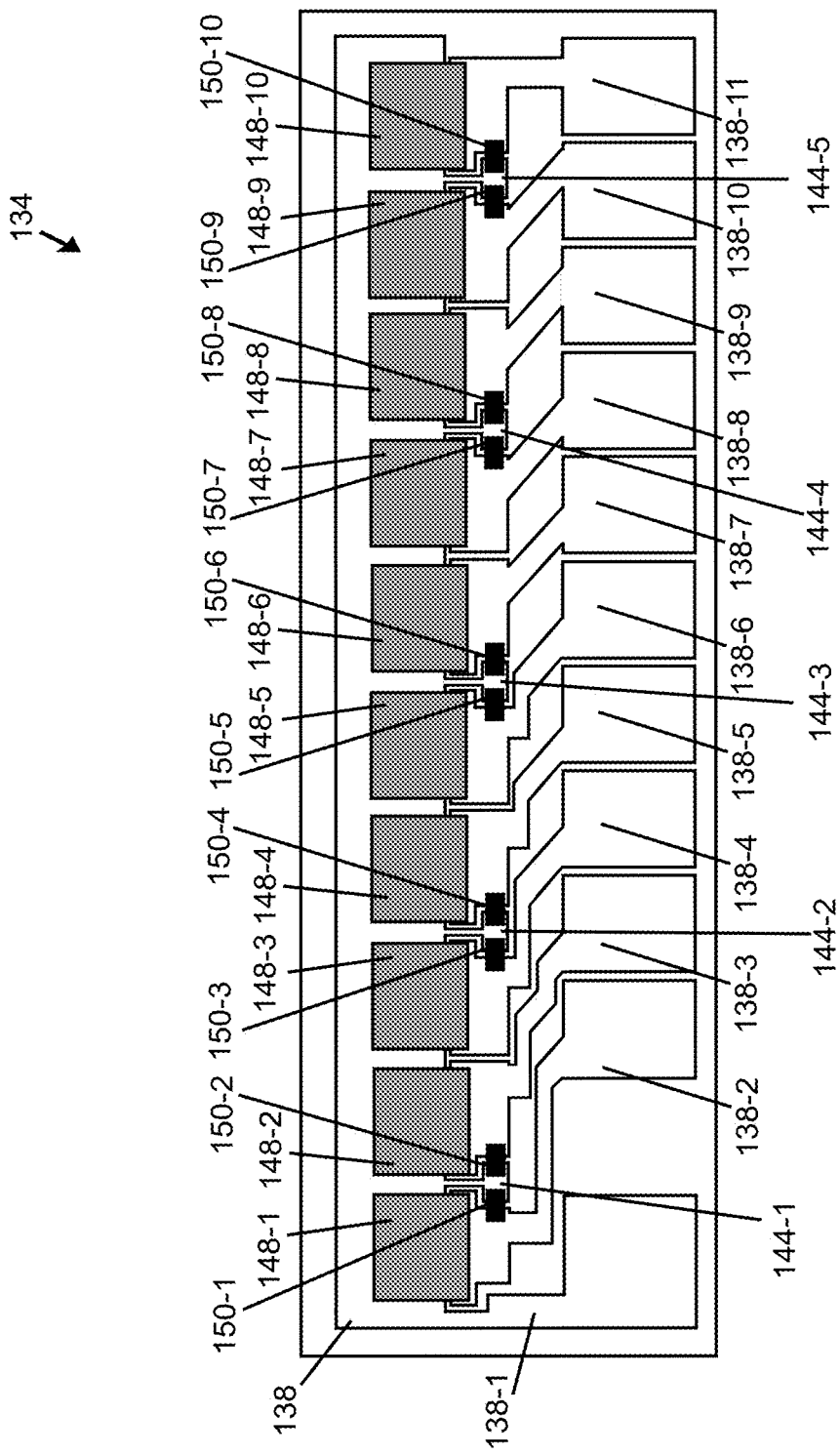
FIG._15B

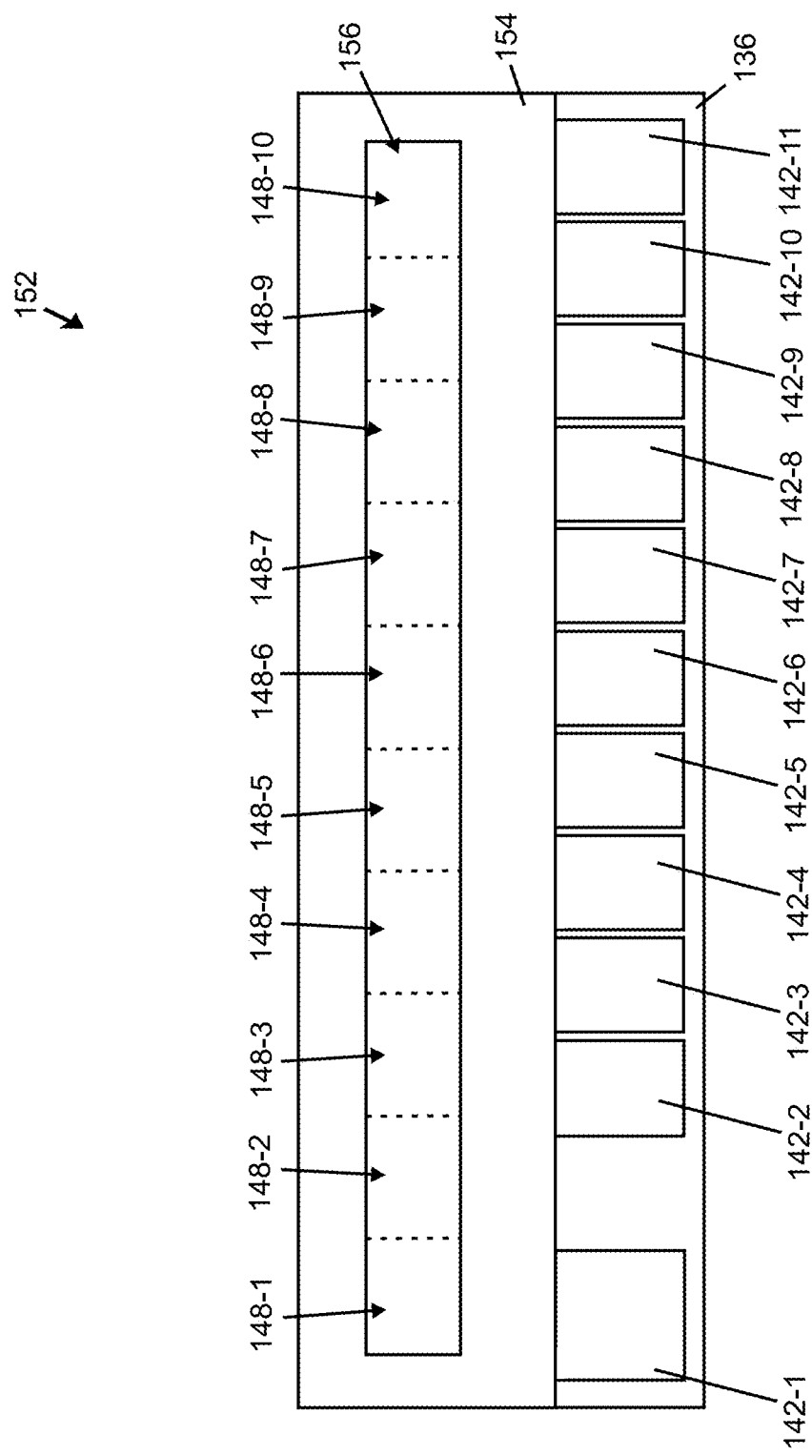
FIG._16

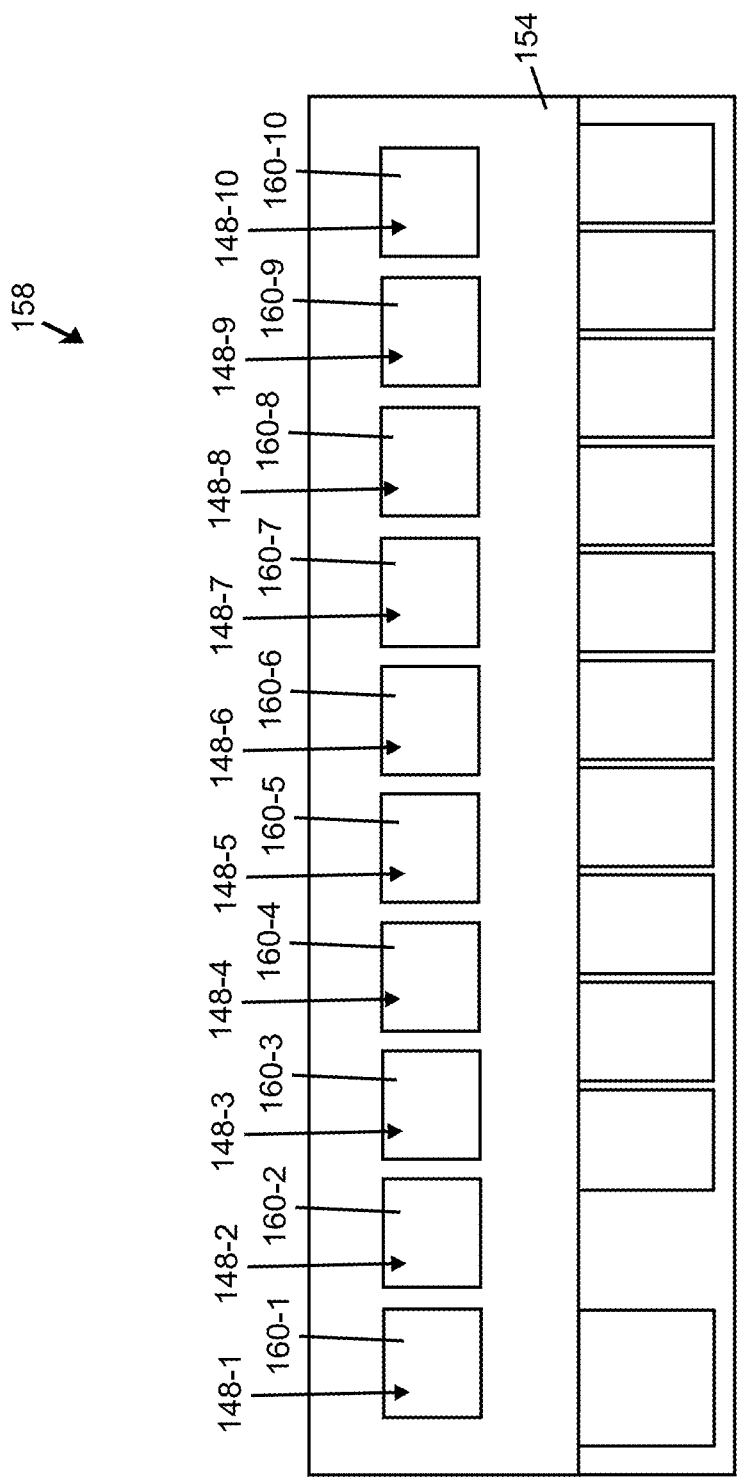

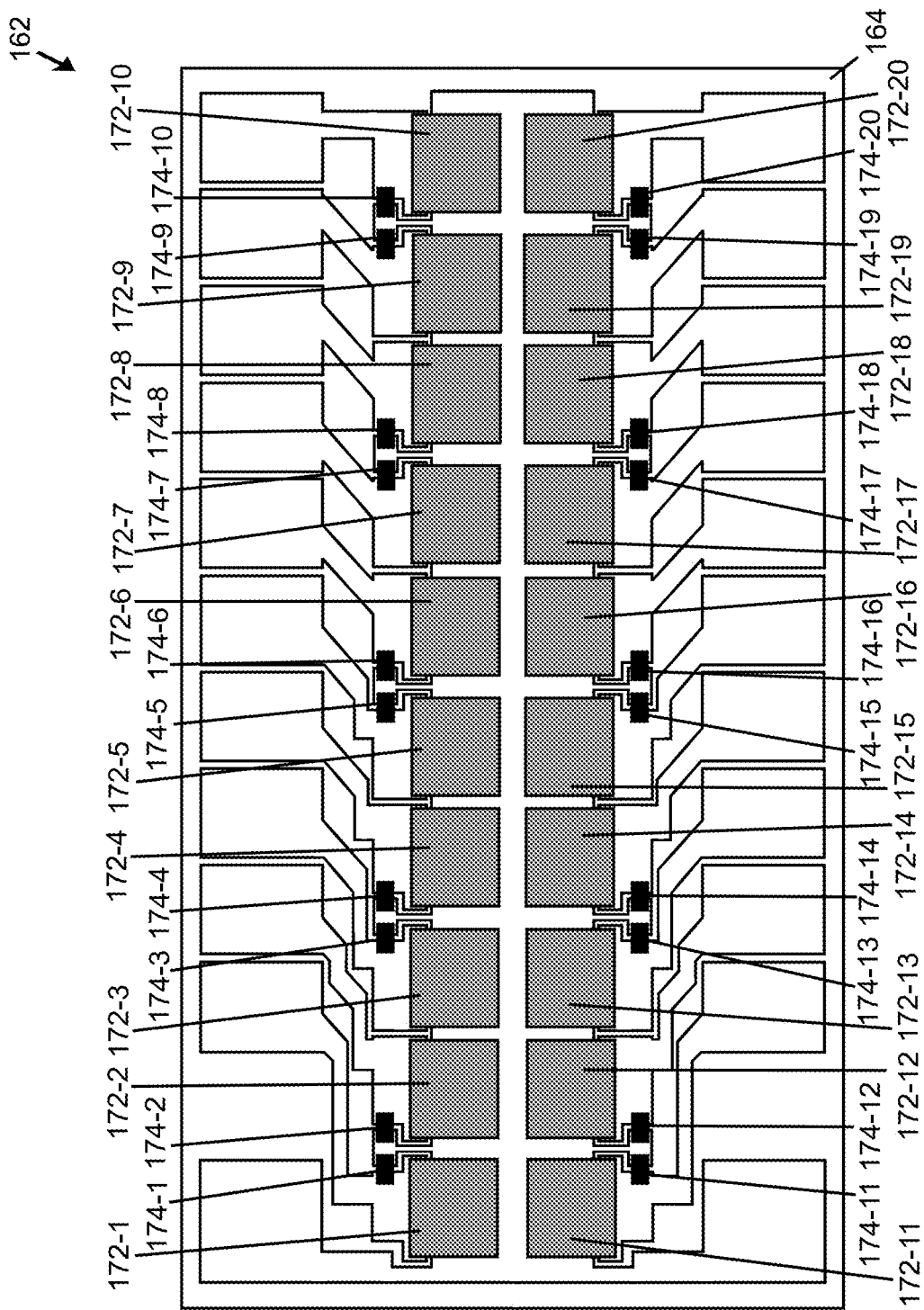
FIG._18B

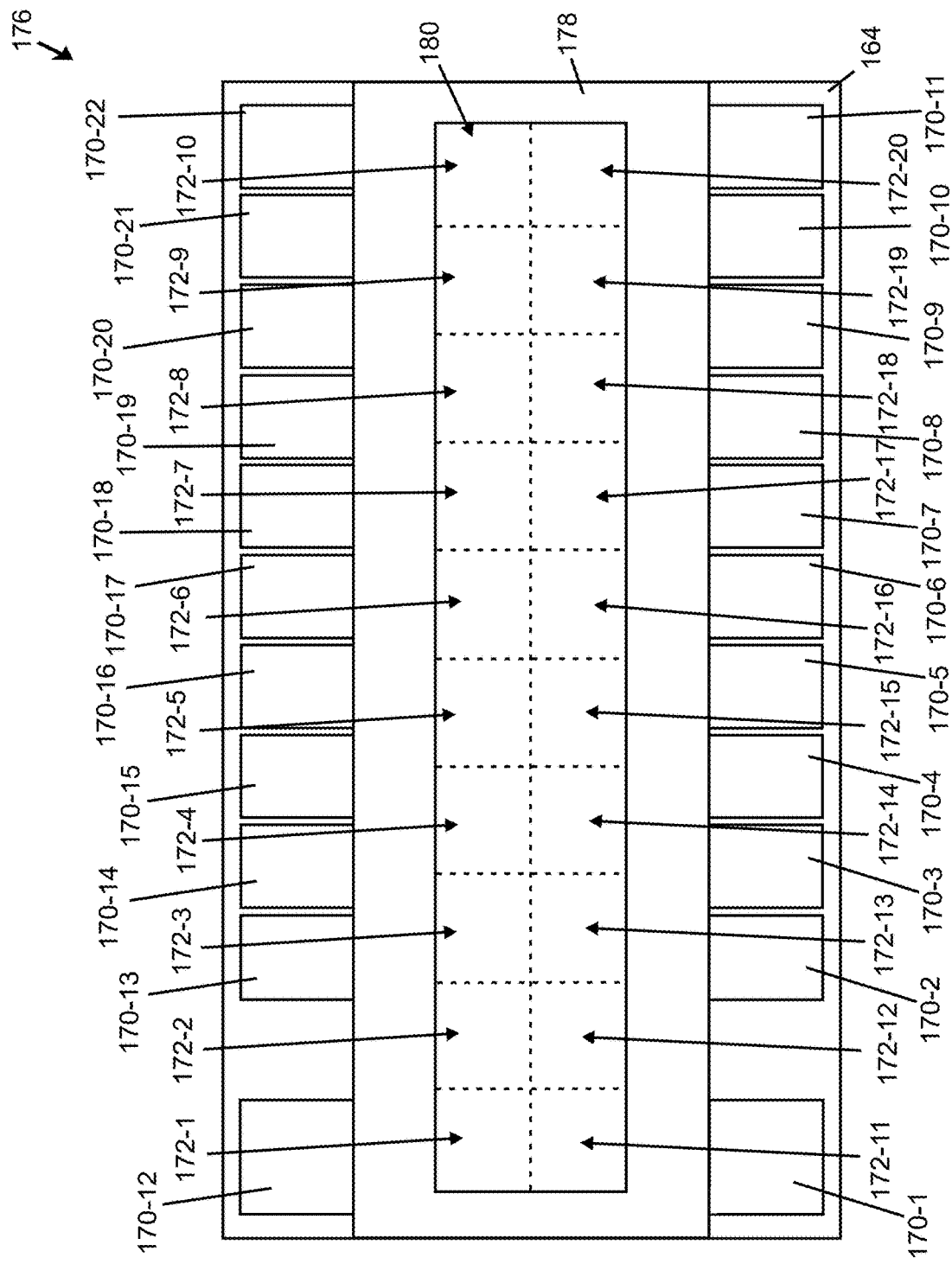
FIG._19

LIGHT-EMITTING DIODE PACKAGES WITH INDIVIDUALLY CONTROLLABLE LIGHT-EMITTING DIODE CHIPS

RELATED APPLICATION

This application claims the benefit of provisional patent application Ser. No. 62/676,697, filed May 25, 2018, the disclosure of which is hereby incorporated herein by reference in its entirety.

FIELD OF THE DISCLOSURE

The present disclosure relates to solid-state lighting devices including light-emitting diodes, and more particularly to packaged light-emitting diodes with individually controllable light-emitting diode chips.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

FIG. 1 illustrates a typical LED package 10 including a single LED chip 12 that is mounted on a reflective cup 14 by means of a solder bond or conductive epoxy. One or more wire bonds 16 can connect ohmic contacts of the LED chip 12 to leads 18A and/or 18B, which may be attached to or integral with the reflective cup 14. The reflective cup 14 may be filled with an encapsulant material 20, which may contain a wavelength conversion material such as a phosphor. At least some light emitted by the LED chip 12 at a first wavelength may be absorbed by the phosphor, which may responsively emit light at a second wavelength. The entire assembly is then encapsulated in a clear protective resin 22, which may be molded in the shape of a lens to collimate the light emitted from the LED chip 12. While the reflective cup 14 may direct light in an upward direction, optical losses may occur when the light is reflected. Some light may be absorbed by the reflective cup 14 due to the less than 100% reflectivity of practical reflector surfaces. Some metals can have less than 95% reflectivity in the wavelength range of interest.

FIG. 2 shows another conventional LED package 24 in which one or more LED chips 26 can be mounted onto a carrier such as a printed circuit board (PCB) carrier, substrate, or submount 28. A metal reflector 30 is mounted on the submount 28 and surrounds the LED chips 26 to reflect light emitted by the LED chips 26 away from the LED package 24. The metal reflector 30 also provides mechanical protection to the LED chips 26. One or more wire bond connections 32 are made between ohmic contacts on the LED chips 26 and electrical traces 34A, 34B on the submount 28. The mounted LED chips 26 are then covered with an encapsulant 36, which may provide environmental and mechanical protection to the LED chips 26 while also acting as a lens. The metal reflector 30 is typically attached to the submount 28 by means of a solder or epoxy bond. The metal reflector 30 may also experience optical losses when the light is reflected because it also has less than 100% reflectivity.

FIG. 3 shows another conventional LED package 38 in which an LED chip 40 can be mounted on a submount 42 with a hemispheric lens 44 formed over it. The LED chip 40 can be coated by a conversion material that can convert all or most of the light from the LED chip 40. The hemispheric lens 44 is arranged to reduce total internal reflection of light. The lens 44 is made relatively large compared to the LED chip 40 so that the LED chip 40 approximates a point light source under the lens 44. As a result, an increased amount of LED light that reaches the surface of the lens 44 emits from the lens 44 on a first pass. Additionally, the lens 44 can be useful for directing light emission from the LED chip 40 in a desired emission pattern for the LED package 38.

LEDs have been widely adopted in various illumination contexts, for backlighting of liquid crystal display (LCD) systems (e.g., as a substitute for cold cathode fluorescent lamps), and for sequentially illuminated LED displays. Applications utilizing LED arrays include vehicular headlamps, roadway illumination, light fixtures, and various indoor, outdoor, and specialty contexts. Desirable characteristics of LED devices include high luminous efficacy, long lifetime, and wide color gamut.

Various LED array applications, including (but not limited to) high resolution displays suitable for very short viewing distances, as well as vehicular headlamps, may benefit from smaller LED pitches; however, practical considerations have limited their implementation. Conventional pick-and-place techniques useful for mounting LED components and packages to PCBs may be difficult to implement in a reliable manner in high-density arrays with small LED pitches. Additionally, due to the omnidirectional character of LED and phosphor emissions, it may be difficult to prevent emissions of one LED (e.g., a first pixel) from significantly overlapping emissions of another LED (e.g., a second pixel) of an array, which would impair the effective resolution of an LED array device. It may also be difficult to avoid non-illuminated or "dark" zones between adjacent LEDs (e.g., pixels) to improve homogeneity, particularly while simultaneously reducing crosstalk or light spilling between emissions of the adjacent LEDs. The art continues to seek improved LED array devices with small pixel pitches while overcoming limitations associated with conventional devices and production methods.

SUMMARY

The present disclosure relates in various aspects to solid-state light emitting devices including light-emitting diodes (LEDs), and more particularly to packaged LEDs that include individually controllable LED chips. In some embodiments, an LED package includes electrical connections that are configured to reduce corrosion of metals within the package; or decrease the overall forward voltage of the LED package; or provide an electrical path for serially-connected electrostatic discharge (ESD) chips. In some embodiments, an LED package includes an array of LED chips, each of which is individually controllable such that individual LED chips or subgroups of LED chips may be selectively activated or deactivated. A single wavelength conversion element may be provided over the array of LED chips or separate wavelength conversion elements may be provided over one or more individual LED chips of the array. In this manner, LED packages according to the present disclosure may be beneficial for various applications, including those where a high luminous intensity with a controllable brightness or adaptable emission pattern is desired in a variety of environmental conditions. Such applications include automotive lighting, aerospace lighting, and general illumination environments and include vehicular headlamps, roadway illumination, light fixtures, and various indoor, outdoor, and specialty contexts.

In some aspects, an LED package includes a submount; a metal pattern on the submount, wherein the metal pattern includes a plurality of attach pads and a plurality of bond pads; a plurality of LED chips mounted on the plurality of attach pads, wherein each LED chip of the plurality of LED chips is individually controllable; and a bond metal on the plurality of bond pads and on a surface of the submount that is adjacent the plurality of bond pads. The LED package may further include a light-altering material arranged around a perimeter of the plurality of LED chips on the surface of the submount. The light-altering material may cover a portion of the bond metal on the surface of the submount. The light-altering material may comprise a light-reflective material such as fused silica, fumed silica, or titanium dioxide ($TiO_2$) particles suspended in silicone. In some embodiments, the LED package further includes a single wavelength conversion element on the plurality of LED chips. In other embodiments, the LED package includes a separate wavelength conversion element on each LED chip of the plurality of LED chips. A light-altering material may be arranged around a perimeter of the plurality of LED chips and between adjacent LED chips of the plurality of LED chips.

In some embodiments, the metal pattern comprises a plurality of metal traces that electrically connect between individual attach pads of the plurality of attach pads and individual bond pads of the plurality of bond pads. At least one ESD chip may be electrically connected to each metal trace of the plurality of metal traces. The bond metal may include a conductive finger that extends on at least one metal trace of the plurality of metal traces. In some embodiments, the plurality of bond pads include a cathode pad and a plurality of anode pads. Each attach pad of the plurality of attach pads may include a portion of a cathode metal trace that is continuous with the cathode pad and a plurality of anode metal traces that are continuous with corresponding anode pads of the plurality of anode pads. The cathode metal trace may include a plurality of metal trace extensions that extend between the plurality of LED chips and between the plurality of anode metal traces. In some embodiments, a plurality of ESD chips are electrically connected between the plurality of metal trace extensions and the plurality of anode metal traces. At least two ESD chips of the plurality of ESD chips may be electrically connected to the same metal trace extension.

In some aspects, an LED package includes a submount; a metal pattern on the submount, wherein the metal pattern comprises a plurality of attach pads and a plurality of bond pads; a plurality of LED chips mounted on the plurality of attach pads and arranged in at least two adjacent rows, wherein each LED chip of the plurality of LED chips is individually controllable; and a light-altering material arranged around a perimeter of the plurality of LED chips on the surface of the submount, wherein the plurality of bond pads are at least partially uncovered by the light-altering material. In some embodiments, the LED package further includes a single wavelength conversion element on the plurality of LED chips. In other embodiments, the LED package includes a separate wavelength conversion element on each LED chip of the plurality of LED chips. In some embodiments, the LED package includes a bond metal on the plurality of bond pads and on a surface of the submount that is adjacent the plurality of bond pads. The plurality of bond pads may include a cathode pad and a plurality of anode pads. Each attach pad of the plurality of attach pads may include a cathode metal trace that is continuous with the cathode pad and a plurality of anode metal traces that are continuous with the plurality of anode pads.

In some aspects, an LED package includes a submount; a plurality of bond pads on the submount; a plurality of LED chips mounted on the submount, wherein the plurality of LED chips are laterally spaced from the plurality of bond pads; a plurality of wavelength conversion elements on the plurality of LED chips, wherein individual wavelength conversion elements are registered with individual LED chips of the plurality of LED chips; and a light-altering material arranged around a perimeter of the plurality of LED chips and between adjacent LED chips of the plurality of LED chips. In some embodiments, the light-altering material is arranged around a perimeter of the plurality of wavelength conversion elements and between adjacent wavelength conversion elements of the plurality of wavelength conversion elements. In some embodiments, each wavelength conversion element of the plurality of wavelength conversion elements comprises a superstrate and a lumiphoric material. In certain embodiments, the LED package may further include a bond metal on the plurality of bond pads and on a surface of the submount that is adjacent the plurality of bond pads.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a cross-sectional representation of a conventional light-emitting diode (LED) package.

FIG. 2 illustrates a cross-sectional representation of a conventional LED package.

FIG. 3 illustrates a cross-sectional representation of a conventional LED package.

FIG. 4 is a perspective view of an LED package according to some embodiments.

FIG. 5A illustrates a top view of an LED package according to some embodiments.

FIG. 5B illustrates a top view of an LED package according to some embodiments.

FIG. 5D illustrates a bottom view of the LED package of FIG. 5C according to some embodiments.

FIG. 6A illustrates a top view of an LED package according to some embodiments.

FIG. 6B illustrates a top view of an LED package according to some embodiments.

FIG. 6C is a side view illustration representing a cross-section taken along section line II-II of the LED package of FIG. 6B.

FIG. 6D illustrates a cross-sectional view of the LED package of FIG. 6C with the addition of a light-altering material and a wavelength conversion element.

FIG. 7A illustrates a cross-sectional view of an LED package similar to the LED package of FIG. 6C.

FIG. 7B illustrates a cross-sectional view of an LED package similar to the LED package of FIG. 7A.

FIG. 7C illustrates a cross-sectional view of an LED package similar to the LED package of FIG. 7A.

FIG. 7D illustrates a cross-sectional view of an LED package similar to the LED package of FIG. 6C.

FIG. 8A is a photograph of a portion of a conventional LED package after exposure to corrosion testing.

FIG. 8B is a photograph of a portion of an LED package according to some embodiments after exposure to corrosion testing.

FIG. 9 illustrates a top view of an LED package according to some embodiments.

FIG. 10 illustrates a top view of an LED package according to some embodiments.

FIG. 11A is a plot comparing electrical performance of LED packages with and without conductive fingers of a bond metal according to some embodiments.

FIG. 11B is a plot comparing electrical performance of LED packages after die attach for LED packages with and without conductive fingers of a bond metal according to some embodiments.

FIG. 12A illustrates a cross-sectional view of an LED package according to some embodiments.

FIG. 12B illustrates a cross-sectional view of the LED package of FIG. 12A with a lens according to some embodiments.

FIG. 12C illustrates a cross-sectional view of the LED package of FIG. 12A with a plurality of lenses according to some embodiments.

FIG. 13A illustrates a top view of an LED package according to some embodiments.

FIG. 13B illustrates a bottom view of an LED package according to some embodiments.

FIG. 13C illustrates a bottom view of an LED package according to some embodiments.

FIG. 13D is a side view illustration representing a cross-section of the LED package taken along section line III-III of FIG. 13A.

FIG. 14 illustrates a top view of a panel from an intermediate step of manufacturing according to some embodiments.

FIG. 15A illustrates a top view of a partially-assembled LED package according to some embodiments FIG. 15B illustrates a top view of the partially-assembled LED package of FIG. 15A.

FIG. 16 illustrates a top view of an LED package according to some embodiments.

FIG. 17 illustrates a top view of an LED package according to some embodiments.

FIG. 18B illustrates a top view of the partially-assembled LED package FIG. 18A.

FIG. 19 illustrates a top view of an LED package according to some embodiments.

DETAILED DESCRIPTION

Figure 5C:
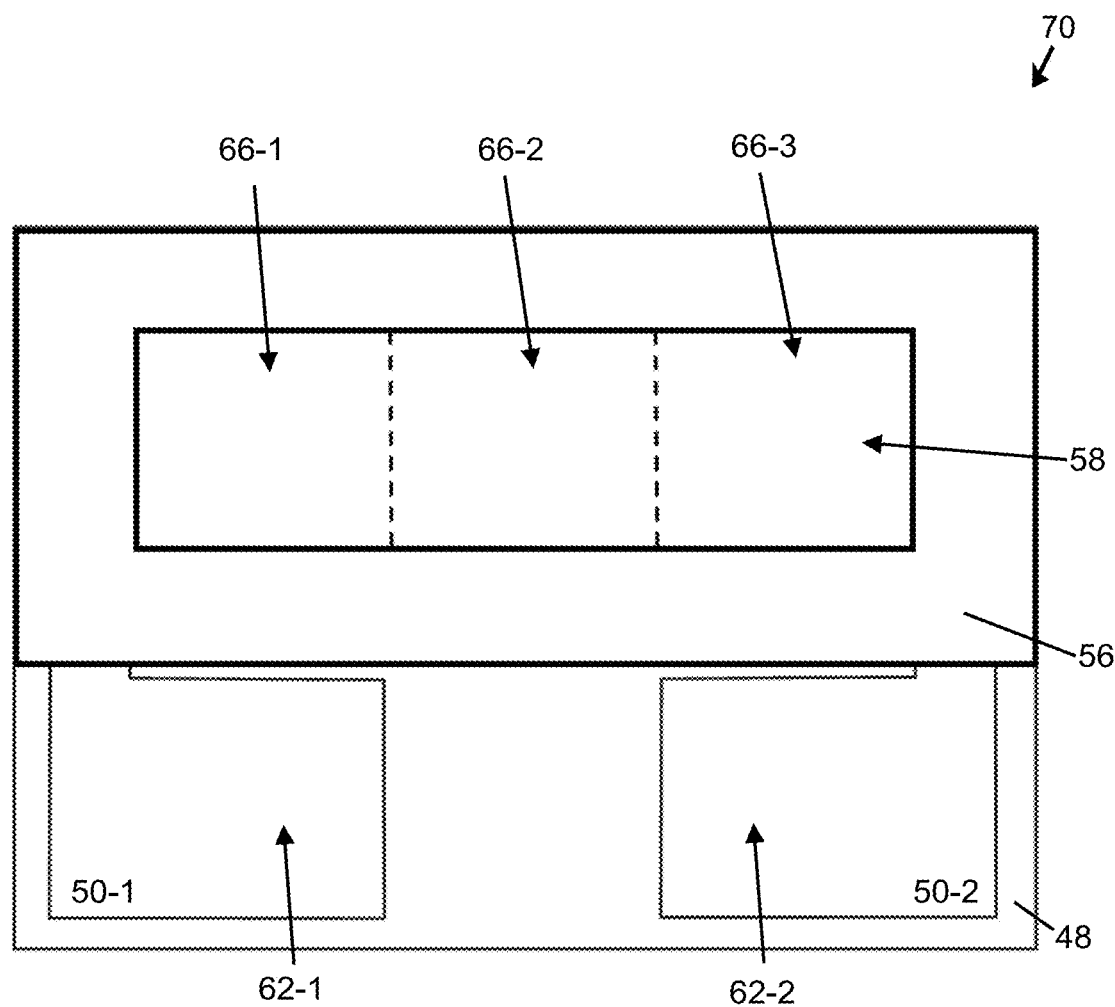
FIG. 5C illustrates a top view of an LED package according to some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures.

It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates in various aspects to solid-state light emitting devices including light-emitting diodes (LEDs), and more particularly to packaged LEDs that include individually controllable LED chips. In some embodiments, an LED package includes electrical connections that are configured to reduce corrosion of metals within the package; or decrease the overall forward voltage of the LED package; or provide an electrical path for serially-connected electrostatic discharge (ESD) chips. In some embodiments, an LED package includes an array of LED chips, each of which is individually controllable such that individual LED chips or subgroups of LED chips may be selectively activated or deactivated. A single wavelength conversion element may be provided over the array of LED chips, or separate wavelength conversion elements may be provided over one or more individual LED chips of the array. In this manner, LED packages according to the present disclosure may be beneficial for various applications, including those where a high luminous intensity with a controllable brightness or adaptable emission pattern is desired in a variety of environmental conditions. Such applications include automotive lighting, aerospace lighting, and general illumination environments and include vehicular headlamps, roadway illumination, light fixtures, and various indoor, outdoor, and specialty contexts.

An LED chip typically comprises an active LED structure or region that can have many different semiconductor layers arranged in different ways. The fabrication and operation of LEDs and their active structure are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to: buffer layers, nucleation layers, super lattice structures, un-doped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. In some embodiments, the active LED structure emits a blue light in a peak wavelength range of approximately 430 nanometers (nm) to 480 nm. In other embodiments, the active LED structure emits green light in a peak wavelength range of 500 nm to 570 nm. In other embodiments, the active LED structure emits red light in a peak wavelength range of 600 nm to 650 nm. The LED chip can also be covered with one or more lumiphors or other conversion materials, such as phosphors, such that at least some of the light from the LED passes through one or more phosphors and is converted to one or more different wavelengths of light. In some embodiments, the LED chip emits a generally white light combination of light from the active LED structure and light from the one or more phosphors. The one or more phosphors may include yellow (e.g., YAG:Ce), green (LuAg:Ce), and red ($Ca_{1-x-y}Sr_xEu_yAlSiN_3$) emitting phosphors, and combinations thereof.

The present disclosure can include LED chips having a variety of geometries, such as vertical geometry or lateral geometry. A vertical geometry LED chip typically includes an anode and cathode on opposing sides of the active LED structure. A lateral geometry LED chip typically includes an anode and a cathode on the same side of the active LED structure that is opposite a substrate, such as a growth substrate or a carrier substrate. In some embodiments, a lateral geometry LED chip may be mounted on a submount of an LED package such that the anode and cathode are on a face of the active LED structure that is opposite the submount. In this configuration, wire bonds may be used to provide electrical connections with the anode and cathode. In other embodiments, a lateral geometry LED chip may be flip-chip mounted on a submount of an LED package such that the anode and cathode are on a face of the active LED structure that is adjacent to the submount. In this configuration, electrical traces or patterns may be provided on the submount for providing electrical connections to the anode and cathode of the LED chip. In a flip-chip configuration, the active LED structure is configured between the substrate of the LED chip and the submount for the LED package. Accordingly, light emitted from the active LED structure may pass through the substrate in a desired emission direction. In some embodiments, the flip-chip LED chip may be configured as described in commonly-assigned U.S. Patent Application Publication No. 2017/0098746, now U.S. Pat. No. 10,991,861, which is hereby incorporated by reference herein.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

FIG. 4 is a perspective view of an LED package 46 according to some embodiments. The LED package 46 includes a submount 48 that can be formed of many different materials with a preferred material being electrically insulating. Suitable materials include, but are not limited to ceramic materials such as aluminum oxide or alumina, AlN, or organic insulators like polyimide (PI) and polyphthalamide (PPA). In other embodiments the submount 48 can comprise a printed circuit board (PCB), sapphire, Si or any other suitable material. For PCB embodiments, different PCB types can be used such as standard FR-4 PCB, metal core PCB, or any other type of PCB. At least a portion of a metal pattern 50 is visible on the submount 48. Package contacts 52-1, 52-2 comprise at least a portion of the metal pattern 50 and include an anode contact and a cathode contact configured to receive an electrical connection from a power source external to the LED package 46. In some embodiments, a portion 51 of the submount 48 includes identification or other information about the LED package 46, including a quick response (QR) code, a bar code, or alphanumeric information. In FIG. 4, the portion 51 is illustrated between the package contacts 52-1, 52-2. However, in other embodiments, the portion 51 that includes identification or other information may be located on other areas of the submount 48.

A plurality of LED chips 54-1 to 54-3 are visible on the submount 48, and a light-altering material 56 is arranged around a perimeter of the LED chips 54-1 to 54-3 on a surface of the submount 48. While the LED package 46 is designed with three LED chips 54-1 to 54-3, any number of LED chips are possible. In some embodiments, LED packages according to embodiments disclosed herein may include a single LED chip, or two LED chips, or three LED chips, or more. In some embodiments, the light-altering material 56 is configured to redirect or reflect laterally-emitting light from the LED chips 54-1 to 54-3 toward a desired emission direction. In other embodiments, the light-altering material 56 may block or absorb at least of portion of any laterally-emitting light from the LED chips 54-1 to 54-3 that would otherwise escape the LED package 46 with high or wide emission angles. The light-altering material 56 may partially cover the submount 48 outside of where the LED chips 54-1 to 54-3 are located. In that regard, the light-altering material 56 may cover portions of the metal pattern 50 that extend from the package contacts 52-1, 52-2 to the LED chips 54-1 to 54-3. The light-altering material 56 may be adapted for dispensing, or placing, and may include many different materials including light-reflective materials that reflect or redirect light, light-absorbing materials that absorb light, and materials that act as a thixotropic agent. In some embodiments, the light-altering material 56 may include at least one of fused silica, fumed silica, and titanium dioxide ($TiO_2$) particles suspended in a binder, such as silicone or epoxy. In some embodiments, the light-altering material 56 may comprise a white color to reflect and redirect light. In other embodiments, the light-altering material 56 may comprise an opaque or black color for absorbing light and increasing contrast of the LED package 46. The light-altering material 56 can be dispensed or deposited in place using an automated dispensing machine where any suitable size and/or shape can be formed. The light-altering material 56 may include a cross-sectional profile comprising a planar top surface with vertical side surfaces or a curved top surface with vertical side surfaces. In other embodiments, the light-altering material 56 may comprise other shapes, including a planar or curved top surface with non-planar or non-vertical side surfaces. In some embodiments, at least a portion of the light-altering material 56 may extend to one or more edges of the submount 48. In FIG. 4, the light-altering material 56 extends to three edges of the submount 48, but does not extend to a fourth edge of the submount 48, thereby leaving the package contacts 52-1, 52-2 uncovered.

In some embodiments, a wavelength conversion element 58 is arranged over the plurality of LED chips 54-1 to 54-3 on the submount 48. In some embodiments, the light-altering material 56 is also arranged around a perimeter of the wavelength conversion element 58. In some embodiments, the wavelength conversion element 58 includes one or more lumiphoric materials. Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, spray coating, inkjet printing, or the like). In certain embodiments, lumiphoric materials may be deposited utilizing one or more applications of a spray coating after the LED chip is mounted on the submount 48, as described in commonly-assigned U.S. Patent Application Publication No. 2017/0098746. In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In some embodiments, one or more phosphors may include yellow phosphors (e.g., YAG:Ce), green phosphors (LuAg:Ce), and red phosphors (Cai-x-ySrxEuyAlSiN3) and combinations thereof. In certain embodiments, the wavelength conversion element 58 includes embodiments as described in commonly-assigned U.S. Patent Application Publication No. 2018/0033924, now U.S. Pat. No. 10,290,777, which is hereby incorporated by reference herein.

FIG. 5A illustrates a top view of a partially-assembled LED package 60 according to some embodiments. The LED package 60 is similar to the LED package 46 of FIG. 4, except only the submount 48 and the metal pattern 50 are present. The metal pattern 50 includes a plurality of metal traces 50-1 to 50-5. Each metal trace 50-1 to 50-5 includes a continuous metal formed on a surface of the submount 48, and each metal trace 50-1 to 50-5 is discontinuous with each other. The metal pattern 50 forms a plurality of die attach pads 61-1 to 61-3 that are indicated by dashed-line boxes in FIG. 5A. The die attach pads 61-1 to 61-3 are configured to receive a plurality of LED chips. For example, the die attach pad 61-1 includes a portion of the metal trace 50-1 and a portion of the metal trace 50-4. Accordingly, an anode of an LED chip may be mounted or attached to the metal trace 50-1 while a cathode of the LED chip may be mounted or attached to the metal trace 50-4. In a similar manner, the die attach pad 61-2 includes a portion of the metal trace 50-4 and a portion of the metal trace 50-5, and the die attach pad 61-3 includes a portion of the metal trace 50-2 and a portion of the metal trace 50-5. Additionally, a portion of the metal trace 50-1 and a portion of the metal trace 50-2 form bond pads 62-1 and 62-2, respectively. The bond pads 62-1, 62-2 form a portion of the package contacts 52-1, 52-2 of FIG. 4. In that regard, the metal trace 50-1 is continuous with at least a portion of the die attach pad 61-1 and the bond pad 62-1; and the metal trace 50-2 is continuous with at least a portion of the die attach pad 61-3 and the bond pad 62-2. In some embodiments, the metal pattern 50 includes one or more test tabs 63-1, 63-2 that allow for individual testing of LED chips that are mounted to the die attach pads 61-1 to 61-3. For example, in FIG. 5A, the metal trace 50-4 includes the test tab 63-1 and the metal trace 50-5 includes the test tab 63-2. The one or more test tabs 63-1, 63-2 are outside an area of the die attach pads 61-1 to 61-3. In that regard, the one or more test tabs 63-1, 63-2 are accessible after LED chips are mounted in the LED package 60.

The metal pattern 50 may include any number of electrically conductive materials. In some embodiments, the metal pattern 50 includes at least one of the following; copper (Cu) or alloys thereof, nickel (Ni) or alloys thereof, nickel chromium (NiCr), gold (Au) or alloys thereof, electroless Au, electroless silver (Ag), NiAg, Al or alloys thereof, titanium tungsten (TiW), titanium tungsten nitride (TiWN), electroless nickel electroless palladium immersion gold (ENEPIG), electroless nickel immersion gold (ENIG), hot air solder leveling (HASL), and organic solderability preservative (OSP). In certain embodiments, the metal pattern 50 includes a first layer of Cu or Ni followed by a layer of ENEPIG or ENIG that conformally covers a top and sidewalls of the first layer of Cu or Ni.

FIG. 5B illustrates a top view of a partially-assembled LED package 64 according to some embodiments. The LED package 64 is similar to the LED package 60 of FIG. 5A, except a plurality of LED chips 66-1 to 66-3 and a plurality of ESD chips 68-1, 68-2 are mounted on the metal pattern 50. In some embodiments, an anode of the first LED chip 66-1 is mounted or attached to the first metal trace 50-1 while a cathode of the first LED chip 66-1 is mounted or attached to the fourth metal trace 50-4. An anode of the second LED chip 66-2 is mounted or attached to the fourth metal trace 50-4 while a cathode of the second LED chip 66-2 is mounted or attached to the fifth metal trace 50-5. An anode of the third LED chip 66-3 is mounted or attached to the fifth metal trace 50-5 while a cathode of the third LED chip 66-3 is mounted or attached to the second metal trace 50-2. In that regard, each of the plurality of LED chips 66-1 to 66-3 are electrically connected in series with each other between the first metal trace 50-1 and the second metal trace 50-2. In some embodiments, the LED chips 66-1 to 66-3 may be flip-chip mounted to the metal traces 50-1, 50-2, 50-4, 50-5. The LED chips 66-1 to 66-3 may be configured as described in commonly-assigned U.S. Patent Application Publication No. 2017/0098746, now U.S. Pat. No. 10,991,861, which is hereby incorporated by reference herein.

The first ESD chip 68-1 is attached or mounted to the first metal trace 50-1 and the third metal trace 50-3, and the second ESD chip 68-2 is attached or mounted to the third metal trace 50-3 and the second metal trace 50-2. In that regard, each of the plurality of ESD chips 68-1, 68-2 are electrically connected in series between the first metal trace 50-1 and the second metal trace 50-2. Stated differently, the first ESD chip 68-1 is electrically connected to the first metal trace 50-1, the second ESD chip 68-2 is electrically connected to the second metal trace 50-2, and the third metal trace 50-3 is serially connected between the first ESD chip 68-1 and the second ESD chip 68-2. In this manner, the first ESD chip 68-1 and the second ESD chip 68-2 are arranged in parallel with the LED chips 66-1 to 66-3 between the first metal trace 50-1 and the second metal trace 50-2.

As previously described, the one or more test tabs 63-1, 63-2 are configured to allow for individual testing of the LED chips 66-1 to 66-3 after the LED chips 66-1 to 66-3 and the ESD chips 68-1, 68-2 are mounted to the LED package 64. For example, the LED chip 66-1 may be individually tested via electrical contacts to the first metal trace 50-1 and the test tab 63-1; the LED chip 66-2 may be individually tested via electrical contacts to the one or more test tabs 63-1, 63-2; and finally, the LED chip 66-3 may be individually tested via electrical contacts to the test tab 63-2 and the metal trace 50-2. Furthermore, subgroups of the LED chips 66-1 to 66-3 may be tested together. For example, the LED chips 66-1 and 66-2 may be tested as a pair via electrical contacts to the metal trace 50-1 and the test tab 63-2.

FIG. 5C illustrates a top view of an LED package 70 according to some embodiments. The LED package 70 is similar to the LED package 64 of FIG. 5B, except the LED package 70 includes the light-altering material 56 and the wavelength conversion element 58 as previously-described. As illustrated, the LED chips 66-1 to 66-3 are laterally spaced from the bond pads 62-1, 62-2 on the submount 48. The light-altering material 56 is arranged around a perimeter of the LED chips 66-1 to 66-3 on a surface of the submount 48. Notably, the light-altering material 56 covers the first ESD chip 68-1 and the second ESD chip 68-2 of FIG. 5B on the surface of the submount 48. ESD chips are typically dark in color and may therefore absorb light. The light-altering material 56 may include light reflective particles as previously described, and accordingly, the amount of light from the LED chips 66-1 to 66-3 that may reach the ESD chips (68-1, 68-2 of FIG. 5B) is reduced. In some embodiments, the light-altering material 56 does not cover the entire surface of the submount 48. For example, the light-altering material 56 may extend to at least one lateral edge of the submount 48, but not all lateral edges of the submount 48. In particular, a portion of the first metal trace 50-1 and a portion of the second metal trace 50-2 are not covered by the light-altering material 56. In that regard, the bond pads 62-1, 62-2 of the metal traces 50-1, 50-2 form at least a portion of the package contacts (see, for example 52-1, 52-2 of FIG. 4). Under some operating conditions, the portions of the metal traces 50-1, 50-2 that are not covered by the light-altering material 56 may experience corrosion that adversely impacts the performance of the LED package 70. For example, Cu is known to be susceptible to oxidation with exposure to air. In embodiments where the metal traces 50-1, 50-2 include Cu, portions of the metal traces 50-1, 50-2 may form Cu oxide that is black in color. In some embodiments, the metal traces 50-1, 50-2 may further include a surface finish such as ENEPIG; however, corrosion and oxidation of the metal traces 50-1, 50-2 may still occur under some operation conditions.

FIG. 5D illustrates a bottom view of the LED package 70 of FIG. 5C according to some embodiments. In some embodiments, the bottom side of the submount 48 may include a mount pad 71 that is configured for mounting the LED package 70 to another surface, such as a PCB or a housing for a lighting fixture. The mount pad 71 may include a metal, such as Cu or alloys thereof, Ni or alloys thereof, NiCr, Au or alloys thereof, electroless Au, electroless Ag, NiAg, Al or alloys thereof, TiW, TiWN, ENIG, HASL, and OSP. In some embodiments, the mount pad 71 includes a thickness that is similar to a thickness of the metal pattern 50 (FIG. 5B). In some embodiments where the mount pad 71 includes a metal, the mount pad 71 may be configured to provide a metal-to-metal bond with a corresponding metal pad that is located on another surface. In operation, the mount pad 71 may also provide a thermal path, or a heat sink, that assists in dissipating heat generated by the LED package 70. Additionally, the mount pad 71 may provide structural integrity for the LED package 70 during various manufacturing steps. For example, before singulation, the LED package 70 may be part of a larger panel of LED packages, each of which includes a corresponding mount pad. Each of the corresponding mount pads may assist in keeping the panel flat during subsequent processing steps. In other embodiments, it may be desirable to mount the LED package 70 to another surface without a mount pad 71. For example, the LED package 70 may be glued directly to another surface without a mount pad 71.

FIG. 6A illustrates a top view of an LED package 72 according to some embodiments. The LED package 72 is similar to the LED package 70 of FIG. 5C, except the LED package 72 includes a bond metal 74 that covers the bond pads 62-1, 62-2 of the exposed portions of the metal traces 50-1, 50-2. The one or more test tabs 63-1, 63-2 of FIG. 5A and FIG. 5B are not shown in FIG. 6A, but it is understood the one or more test tabs 63-1, 63-2 are applicable to all embodiments disclosed herein, including FIG. 6A. The bond metal 74 may include one or more layers of a conductive metal that is configured to receive and bond with an external electrical connection. The bond metal 74 may comprise a different metal than the metal traces 50-1, 50-2. For example, in some embodiments, the bond metal 74 includes Al or alloys thereof and is arranged to be bonded with one or more wire bonds that are electrically connected to an external power source. In other embodiments, the bond metal 74 and the metal traces 50-1, 50-2 may include different metals selected from the following: Cu or alloys thereof, Ni or alloys thereof, NiCr, Au or alloys thereof, electroless Au, electroless Ag, NiAg, Al or alloys thereof, TiW, TiWN, ENEPIG, ENIG, HASL, and OSP. In this manner, the bond metal 74 and the bond pads 62-1, 62-2 collectively form package contacts as previously described (see, for example 52-1, 52-2 of FIG. 4). The bond metal 74 may be formed by various deposition techniques including sputtering, evaporation, plating, and patterning. Patterning may include various techniques that include masking and/or etching back of deposited material. The bond metal 74 is on the bond pads 62-1, 62-2 and on a surface of the submount 48 that is adjacent the bond pads 62-1, 62-2. Stated differently, the bond metal 74 covers the portions of the metal traces 50-1, 50-2 that are uncovered by the light-altering material 56 and the wavelength conversion element 58. In this manner, the bond metal 74 serves as a barrier between the metal traces 50-1, 50-2 and the surrounding atmosphere, thereby reducing potential corrosion of the metal traces 50-1, 50-2. Accordingly, in this configuration, the bond metal 74 serves as a corrosion-reducing layer. In some embodiments, a portion of the bond metal 74 extends underneath the light-altering material 56 such that the portion of the bond metal 74 is between the light-altering material 56 and the submount 48.

FIG. 6B illustrates a top view of a partially-assembled LED package 76 according to some embodiments. The LED package 76 is similar to the LED package 72 of FIG. 6A, except the light-altering material 56 and the wavelength conversion element 58 of FIG. 6A are not present. The LED package 76 includes the LED chips 66-1 to 66-3 and the ESD chips 68-1, 68-2 serially connected by the metal trace 50-3 as previously described. As illustrated, the bond metal 74 covers portions of the metal traces 50-1, 50-2 and includes bond metal portions 74' that are covered after the light-altering material of previous embodiments is formed.

FIG. 6C is a side view illustration representing a cross-section taken along section line II-II of the LED package 76 of FIG. 6B. A portion of the first metal trace 50-1 is covered by the bond metal 74. In particular, the bond metal 74 is on a top surface and sidewalls of the portion of the first metal trace 50-1 as well as on a surface of the submount 48 that is adjacent the portion of the first metal trace 50-1. The LED chip 66-1 is on a different portion of the first metal trace 50-1, and the ESD chip 68-1 is on the third trace 50-3. FIG. 6D illustrates the cross-sectional view of the LED package 76 of FIG. 6C with the addition of the light-altering material 56 and the wavelength conversion element 58. Notably, the light-altering material 56 is arranged around a perimeter of the LED chip 66-1 and covers the ESD chip 68-1 on the submount 48.

FIG. 7A illustrates a cross-sectional view of an LED package 80 similar to the LED package 76 of FIG. 6C. The LED package 80 includes the metal traces 50-1, 50-3 on the submount 48, the LED chip 66-1, and the ESD chip 68-1 as previously described. The LED package 80 further includes an alternative configuration of the bond metal 74. The bond metal 74 is on a top surface of a portion of the first metal trace 50-1, but not on sidewalls of the first metal trace 50-1 or on the surface of the submount 48 that is adjacent the portion of the first metal trace 50-1. The bond metal 74 is arranged to receive an electrical connection, such as a wire bond, from an external power source. In this manner, the bond metal 74 and the portion of the metal trace 50-1 collectively form a package contact as previously described (see, for example 52-1, 52-2 of FIG. 4). A corrosion-reducing layer 82 that is distinct from the bond metal 74 is arranged on a sidewall 50-1' of the metal trace 50-1 as well as on the surface of the submount 48 that is adjacent the first metal trace 50-1. The corrosion-reducing layer 82 may include one or more layers that include at least one of a polymer, a dielectric, or a metal that is different from the bond metal 74. In some embodiments, the corrosion-reducing layer 82 includes at least one layer of Au, platinum (Pt), Ni, Ti, TiW, TiWN, or other alloys thereof in embodiments where the bond metal 74 includes Al.

FIG. 7B illustrates a cross sectional view of an LED package 84 similar to the LED package 80 of FIG. 7A. The LED package 84 includes the metal traces 50-1, 50-3 on the submount 48, the LED chip 66-1, and the ESD chip 68-1 as previously described. The LED package 84 further includes an alternative configuration of the bond metal 74. A corrosion-reducing layer 86 that is distinct from the bond metal 74 is arranged to cover the metal trace 50-1, and the bond metal 74 is arranged on the corrosion-reducing layer 86. In that manner, the corrosion-reducing layer 86 is on the top surface and on the sidewall 50-1' of the metal trace 50-1 as well as on the surface of the submount 48 that is adjacent the first metal trace 50-1. In this configuration, the corrosion-reducing layer 86 may include one or more electrically conductive layers that include a metal that is different from the bond metal 74. In some embodiments, the bond metal 74 includes Al and the corrosion-reducing layer 86 includes one or more layers of Pt, Ni, Ti, TiW, or TiWN, or other alloys thereof.

FIG. 7C illustrates a cross sectional view of an LED package 88 similar to the LED package 80 of FIG. 7A. The LED package 88 includes the metal traces 50-1, 50-3 on the submount 48, the LED chip 66-1, and the ESD chip 68-1 as previously described. The LED package 88 further includes an alternative configuration of the bond metal 74. A first corrosion-reducing layer 90 and a second corrosion-reducing layer 91 that are distinct from the bond metal 74 are arranged to cover the metal trace 50-1. The first corrosion-reducing layer 90 is arranged on the top surface and on the sidewall 50-1' of the metal trace 50-1 as well as on the surface of the submount 48 that is adjacent the first metal trace 50-1. The second corrosion-reducing layer 91 is arranged to cover the first corrosion-reducing layer 90 and is also on the surface of the submount 48 that is adjacent the first corrosion-reducing layer 90. The bond metal 74 is arranged on the second corrosion-reducing layer 91. In this configuration, the first corrosion-reducing layer 90 and the second corrosion-reducing layer 91 may include one or more electrically conductive layers that include a metal that is different from the bond metal 74. In some embodiments, the bond metal 74 includes Al, and the first corrosion-reducing layer 90 includes one or more layers of Pt, Ni, Ti, TiW, or TiWN, or other alloys thereof, and the second corrosion-reducing layer 92 includes at least one of ENEPIG or ENIG.

FIG. 7D illustrates a cross sectional view of an LED package 92 similar to the LED package 76 of FIG. 6C. The LED package 92 includes the metal traces 50-1, 50-3 on the submount 48, the bond metal 74, the LED chip 66-1, and the ESD chip 68-1 as previously described. As also previously described, the metal traces 50-1, 50-3 may include additional layers. For example, in FIG. 7D, an additional metal trace layer 93 is formed or coated on the original metal traces 50-1, 50-3 to form metal traces that include the metal trace 50-1, the additional metal trace layer 93 and the metal trace 50-3, and the additional metal trace layer 93. In some embodiments, the additional metal trace layer 93 includes a layer of metal, such as an electroless metal including Au plating that covers the top surfaces and sidewalls of the metal traces 50-1, 50-3 all the way to the submount 48. In that regard, the additional metal trace layer 93 encapsulate the metal traces 50-1, 50-3 and may provide improved corrosion resistance while still enabling good die attach with the LED chip 66-1 or the ESD chip 68-1. Conventional metal traces may include coatings of ENIG, which can have pin holes in the top layer of Au that are susceptible to corrosion, or ENEPIG, which is more corrosion resistant, but provides a poor die attach for the LED chip 66-1 or the ESD chip 68-1. In some embodiments, the additional metal trace layer 93 may replace coatings or treatments of ENIG or ENEPIG, while in other embodiments, the additional metal trace layer 93 may be provided on a top surface and sidewalls to encapsulate coatings or treatments of ENIG or ENEPIG. In some embodiments, the additional metal trace layer 93 include multiple layers.

In order to test LED packages with corrosion-reducing features as previously described, LED packages with and without corrosion-reducing features were subjected to corrosion testing. The corrosion testing including exposing each of the LED packages to an environment including water vapor and sulfur vapor for a time of about two hundred and forty hours. FIG. 8A is a photograph of a portion of a conventional LED package 94. A package contact 96 is visible and includes a first layer of Cu, followed by a layer of ENEPIG, and followed by a bond metal of Al that is only on a top surface of the package contact 96. A wire bond 98 is electrically connected to the package contact 96. After corrosion testing, a corrosion 100 is clearly visible as black material around the perimeter of the package contact 96. FIG. 8B is a photograph of a portion of an LED package 102 according to embodiments of the present disclosure. A package contact 104 is visible and is configured similar to the embodiments described for FIG. 6A. In that manner, the package contact 104 includes a first layer of Cu, followed by a layer of ENEPIG, and followed by a bond metal of Al that covers the layer of Cu and the layer of ENEPIG and is additionally on a surface 106 of the submount 48 that is adjacent the package contact 104. After corrosion testing, corrosion is noticeably reduced around the perimeter of the package contact 104 as compared to the package contact 96 of FIG. 8A.

FIG. 9 illustrates a top view of a partially-assembled LED package 110 according to some embodiments. The LED package 110 includes the submount 48; the metal traces 50-1 to 50-3; the bond pads 62-1 and 62-2 for the LED package 110; the one or more test tabs 63-1, 63-2; the LED chips 66-1 to 66-3; the ESD chips 68-1, 68-2; and the bond metal 74 as previously described. The metal 74 includes bond metal portions 74" that are covered after the light-altering material of previous embodiments is formed. The bond metal portions 74", which may also be referred to as conductive fingers, extend on a top surface of each of the metal traces 50-1 and 50-2 away from the bond pads 62-1, 62-2 and in a direction toward the LED chips 66-1 to 66-3. In some embodiments, the bond metal portions 74" extend on the top surface of the metal traces 50-1, 50-2 in a manner that at least a portion of the bond metal portions 74" are in close proximity with, or immediately adjacent the LED chips 66-1 to 66-3. In some embodiments, the bond metal portions 74" extend at least to an edge of the LED chips 66-1, 66-3 that is opposite the edge of the LED chips 66-1, 66-3 that is closest to the bond pads 62-1, 62-2. In this regard, the bond metal 74 is configured to receive an electrical connection at the bond pads 62-1, 62-2 and current may travel within the bond metal 74 to or from a position that is in close proximity or immediately adjacent the LED chips 66-1 and 66-3. In embodiments where the bond metal 74 includes a highly conductive metal such as Al or alloys thereof, the forward voltage of the LED package 110 may be reduced. Additionally, for embodiments where the metal traces 50-1, 50-2 include Au, such as ENEPIG, the amount of Au may be reduced, thereby saving costs without compromising current carrying capabilities of the LED package 110. In some embodiments, the bond metal 74 (inclusive of the bond metal portions 74" or fingers) and the metal traces 50-1, 50-2 may include different metals selected from the following: Cu or alloys thereof, Ni or alloys thereof, NiCr, Au or alloys thereof, electroless Au, electroless Ag, NiAg, Al or alloys thereof, TiW, TiWN, ENEPIG, ENIG, HASL, and OSP.

FIG. 10 illustrates a top view of a partially-assembled LED package 112 according to some embodiments. The LED package 112 includes the submount 48; the metal traces 50-1 to 50-3; the bond pads 62-1 and 62-2 for the LED package 112; the one or more test tabs 63-1, 63-2; the LED chips 66-1 to 66-3; the ESD chips 68-1, 68-2; the bond metal 74 and the bond metal portions 74" as previously described. The LED package 112 is similar to the LED package 110 of FIG. 9, except the bond metal 74 covers at least a portion of the metal traces 50-1 and 50-2. Accordingly, the bond metal 74 is also on a surface of the submount 48 that is adjacent portions of the metal traces 50-1 and 50-2. In that regard, after the light-altering material and the wavelength conversion element of previous embodiments is formed, all portions of the metal traces 50-1 and 50-2 that are uncovered by the light-altering material and the wavelength conversion element are covered by the bond metal 74. Accordingly, the bond pads 62-1 and 62-2 for the LED package 112 are more resistant to corrosion.

FIG. 11A is a plot comparing electrical performance of LED packages with and without conductive fingers of the bond metal as described for FIG. 9 and FIG. 10. The bottom of the plot details various LED packages built for the comparisons. As indicated, the various LED packages were built with and without conductive fingers of the bond metal (Al in this case) and as indicated by the "Al finger extension" row with labels Yes (with Al conductive fingers) or No (without Al conductive fingers). The metal traces underneath the bond metal as well as the portions of the metal traces that form the die attach pads as previously described included Au with variable thicknesses as measured in a direction perpendicular to the submount. The Au thickness was varied from 1 to 3 µm for various LED packages as indicated by the "Au Thickness" row. Additionally, a width of the metal trace that extends between and connects the package bond pads and the die attach pads was varied between 450 and 550 µm, as indicated by the label "Side Au metal trace" row. The number of LED chips, or LED die, was also varied between 2 and 3 chips as indicated by the "Die number" row. The y-axis of the plot is the electrical resistance of the metal traces for a fixed current in milliohms. Notably, for every data set of LED packages having the same Au thickness, width, and number of LED chips, the LED packages with Al finger extensions have a substantially decreased electrical resistance. As expected, the resistance of the metal traces also decreases when the Au thickness or width is increased. However, extra Au can add additional costs to the LED package. In that regard, LED packages with metal traces having an Au thickness of 2 µm and including Al finger extensions measured a lower electrical resistance than LED packages with metal traces having an Au thickness of 3 µm and without Al finger extensions. Additionally, for packages with an Au thickness reduced to 1 µm and with Al finger extensions, the electrical resistance was measured close or similar to LED packages having an Au thickness of 2 µm and without Al finger extensions. Accordingly, some embodiments of the present invention include metal traces having an Au thickness of less than 2 µm, or in a range from 1 µm to 2 µm, or in a range from 1 µm to less than 2 µm.

FIG. 11B includes a plot comparing electrical performance of LED packages after die attach for LED packages with and without conductive fingers of the bond metal as described for FIG. 9 and FIG. 10. The bottom of the plot details various LED packages built for the comparisons. As with FIG. 11A, the various LED packages were built with and without conductive fingers of the bond metal (Al in this case) and as indicated by the "Al finger extension" row with labels Yes (with Al conductive fingers); No (without Al conductive fingers); or POR (e.g. process of record and without Al conductive fingers). The metal traces underneath the bond metal as well as the portions of the metal traces that form the die attach pads as previously described included Au with variable thicknesses as measured in a direction perpendicular to the submount. The Au thickness was varied from 1 to 3 µm for various LED packages as indicated by the "Au Thickness" row. Additionally, a width of the metal trace that extends between and connects the LED package bond pads and the die attach pads was varied between 450 and 550 µm, as indicated by the label "Side Au metal trace" row. The "Au Thickness" row and the "Side Au metal trace" row also include the label POR, which does not include Al. The number of LED chips, or LED die, was also varied between 2 and 3 chips as indicated by the "Die number" row. The y-axis of the top portion of the plot is the change in forward voltage ($V_f$), or $V_f$ Delta, in volts, and the y-axis at the bottom portion of the plot is the percentage change in $V_f$, or $V_f$ Delta %, in volts. The table at the bottom of FIG. 11B summarizes the mean values for $V_f$ Delta and $V_f$ Delta % for the number N of LED packages tested. Delta refers to the difference between the POR cells without the Al finger and the other cells with the Al finger. Notably, the presence of an Al finger extension generally improves (lowers) $V_f$, although as the Au thickness increases, the improvement becomes less pronounced. For example, for LED packages with 1 µm of Au, the Al finger provides a mean $V_f$ improvement of about 0.044 volts, or 44 millivolts (mV); for LED packages with 2 µm of Au, the Al finger provides a mean $V_f$ improvement of about 21 mV; and for LED packages with 3 µm of Au, the Al finger provides a mean $V_f$ improvement of about 12 mV. Accordingly, the presence of an Al finger extension and metal traces with Au as previously described can each lower the $V_f$ values closer to the POR while also providing the corrosion resistance as previously described.

FIG. 12A is a cross-sectional view of an LED package 114 according to some embodiments. The cross-sectional view may be similar to a cross-section taken along section line I-I of the LED package 72 of FIG. 6A. The LED package 114 includes the submount 48; the metal traces 50-1, 50-2, 50-4, 50-5; the LED chips 66-1 to 66-3; the light-altering material 56; and the wavelength conversion element 58 as previously described. The wavelength conversion element 58 includes a superstrate 116 that includes a lumiphoric material 118 disposed thereon. The term "superstrate" as used herein refers to an element placed on an LED chip with a lumiphoric material between the superstrate and the LED chip. The term "superstrate" is used herein, in part, to avoid confusion with other substrates that may be part of the semiconductor light emitting device, such as a growth or carrier substrate of the LED chip or a submount of the LED package. The term "superstrate" is not intended to limit the orientation, location, and/or composition of the structure it describes. In some embodiments, the superstrate 116 may be composed of, for example, sapphire, silicon carbide, silicone, and/or glass (e.g., borosilicate and/or fused quartz). The superstrate 116 may be patterned to enhance light extraction from the LED chips 66-1 to 66-3 as described in commonly-assigned U.S. Provisional Application No. 62/661,359 entitled "Semiconductor Light Emitting Devices Including Superstrates With Patterned Surfaces" which is hereby incorporated by reference herein. The superstrate 116 may also be configured as described in previously-referenced U.S. Patent Application Publication No. 2018/0033924, now U.S. Pat. No. 10,290,777, also incorporated by reference herein. The superstrate 116 may be formed from a bulk substrate which is optionally patterned and then singulated. In some embodiments, the patterning of the superstrate 116 may be performed by an etching process (e.g., wet or dry etching). In some embodiments, the patterning of the superstrate 116 may be performed by otherwise altering the surface, such as by a laser or saw. In some embodiments, the superstrate 116 may be thinned before or after the patterning process is performed. The lumiphoric material 118 may then be placed on the superstrate 116 by, for example, spraying and/or otherwise coating the superstrate 116 with the lumiphoric material 118. The superstrate 116 and the lumiphoric material 118 may be attached to the LED chips 66-1 to 66-3 using, for example, a layer of transparent adhesive 119. In some embodiments, when the superstrate 116 is attached to the LED chips 66-1 to 66-3, a portion of the transparent adhesive 119 is positioned at least partially between lateral edges of the LED chips 66-1 to 66-3. In some embodiments, the layer of the transparent adhesive 119 may include silicone with a refractive index in a range of about 1.3 to about 1.6 that is less than a refractive index of the LED chips 66-1 to 66-3. In this manner, at least a portion of light emitted laterally from the LED chips 66-1 to 66-3 may have improved light extraction between the lateral edges of the LED chips 66-1 to 66-3, thereby providing improved overall package brightness as well as improved homogeneity of composite emissions from the LED chips 66-1 to 66-3. Stated differently, the appearance of dark spots due to illumination gaps between the LED chips 66-1 to 66-3 may be reduced.

FIG. 12B illustrates a cross-sectional view of the LED package 114 of FIG. 12A with a lens 120. In some embodiments, the lens 120 may be added to the LED package 114 to improve color angle uniformity. For example, the lens 120 may be configured to reduce the appearance of blue emissions around a lateral perimeter of the LED package 114. The lens 120 may also provide a different light distribution pattern for the LED package 114. In some embodiments, the lens 120 may include a curved upper surface, such as a partial hemisphere, a partial dome, or a partial ellipsoid. In further embodiments, the lens 120 may include a curved upper surface with one or more planar sidewalls. In other embodiments, the lens 120 may have a planar upper surface with planar sidewalls. Many different materials can be used for the lens 120, including silicones, plastics, epoxies, or glass, with a suitable material being compatible with dispensing or molding processes. Silicone is suitable for dispensing or molding and provides good optical transmission properties for light emitted from the LED chips 66-1 to 66-3. In some embodiments, the lens 120 may be dispensed on a surface of the LED package 114. The viscosity of the material used for the lens 120 may be such that the curved upper surface is formed by surface tension. In other embodiments, the lens 120 may be molded over the LED package 114. In some embodiments, the lens 120 may be dispensed or molded onto the superstrate 116 before it is placed in the LED package 114. Alternatively, the lens 120 may be dispensed or molded onto the LED package 114 after the superstrate 116 has been added. In this manner, the lens 120 may extend over both the superstrate 116 and the light-altering material 56.

The LED package 114 may further include an additional light-altering material 121. The additional light-altering material 121 may include at least one of a second lumiphoric material or a light-diffusing material. In some embodiments, the additional light-altering material 121 includes a second lumiphoric material that is either the same as or different than the lumiphoric material 118 (or a first lumiphoric material). In embodiments where the additional light-altering material 121 includes a light-diffusing material, the light-diffusing material may scatter light emitted from the LED chips 66-1 to 66-3 for improvements in color uniformity and color mixing. The additional light-altering material 121 may be formed by deposition or other suitable techniques on the LED package 114 before the lens 120 is formed. In other embodiments, the additional light-altering material 121 may be formed at the same time the lens 120 is formed. For example, the additional light-altering material 121 may include at least one of lumiphoric particles or light-diffusing particles that are suspended in a silicone material. The silicone material may then be dispensed or molded to form the lens 120. For a dispensing process, the silicone material may be cured after the additional light-altering material 121 is allowed to settle closer to the LED chips 66-1 to 66-3. In other embodiments, the silicone material may be cured while the additional light-altering material 121 is distributed throughout the lens 120.

FIG. 12C illustrates a cross-sectional view of the LED package 114 of FIG. 12A with a plurality of lenses 120-1 to 120-3 according to some embodiments. Each of the plurality of lenses 120-1 to 120-3 may be registered with corresponding ones of the plurality of LED chips 66-1 to 66-3. In some embodiments, each of the plurality of lenses 120-1 to 120-3 may comprise a portion of the additional light-altering material 121. In other embodiments, the additional light-altering material 121 may not be present in all of the plurality of lenses 120-1 to 120-3. Individual ones of the plurality of lenses 120-1 to 120-3 may have different shapes than other lenses of the plurality of lenses 120-1 to 120-3 to provide different light emission patterns. In some embodiments, the superstrate 116 may be continuous between the plurality of LED chips 66-1 to 66-3 and the plurality of lenses 120-1 to 120-3. In other embodiments, the superstrate 116 may be divided into a plurality of individual pieces that are each registered with a corresponding lens 120-1 to 120-3 and a corresponding LED chip 66-1 to 66-3.

Embodiments of the present disclosure are not limited to the previously described LED packages. For example, FIG. 13A, FIG. 13B, FIG. 13C, and FIG. 13D illustrate top, bottom, and cross-sectional views respectively of a partially-assembled LED package 122 according to some embodiments. The LED package 122 is similar to previous embodiments, except the package contacts 52-1, 52-2 are on a backside of the submount 48, rather than a frontside of the submount 48 as previously described. The LED package 122 additionally includes the metal traces 50-1 to 50-5; the one or more test tabs 63-1, 63-2; the LED chips 66-1 to 66-3; and the ESD chips 68-1, 68-2 as previously described. One or more conductive vias 124-1 to 124-4 extend through the submount 48 to electrically connect the first metal trace 50-1 and the second metal trace 50-2 to the package contacts 52-1, 52-2, respectively. As illustrated in the bottom view of FIG. 13B, the LED package 122 may further include a thermal pad 125 on the backside of the submount 48. In some embodiments, the thermal pad 125 includes the same materials as the package contacts 52-1, 52-2. In other embodiments, the thermal pad 125 includes different materials. The thermal pad 125 may be electrically isolated from the package contacts 52-1, 52-2 and may be configured to spread heat away from the LED chips 66-1 to 66-3 through the submount 48. FIG. 13C illustrates an alternative configuration for the backside of the submount 48. In FIG. 13C, the package contacts 52-1, 52-2 are larger and take up more surface area on the backside of the submount 48. Accordingly, the package contacts 52-1, 52-2 are electrically connected to the LED chips 66-1 to 66-3 and may also spread heat away from the LED chips 66-1 to 66-3 through the submount 48. FIG. 13D is a side view illustration representing a cross-section of the LED package 122 taken along section line III-III of FIG. 13A. The first metal trace 50-1 and the package contact 52-1 are shown on opposite faces of the submount 48. The conductive vias 124-1, 124-2 extend through the submount 48 to electrically connect the first metal trace 50-1 to the package contact 52-1. In FIG. 13D, the first metal trace 50-1 and the package contact 52-1 are illustrated as having multiple layers 50-1', 50-1" and 52-1', 52-1" respectively. The multiple layers 50-1', 50-1" and 52-1', 52-1" may include any number of electrically conductive materials as described above. In some embodiments, the layers 50-1' and 52-1' include Au, ENIG, or ENEPIG and the layers 50-1" and 52-1" include an electroless Au plating. In FIG. 13D, the layer 52-1" is illustrated as covering sidewalls of the layer 50-1'. In other embodiments, the layer 52-1" may only cover a surface of the layer 50-1' without covering the sidewalls.

In some embodiments, methods of manufacturing LED packages as disclosed herein, include forming multiple LED packages at the same time on a panel and then singulating individual LED packages. FIG. 14 illustrates a top view of a panel 126 from an intermediate step of manufacturing according to some embodiments disclosed herein. As illustrated, the panel 126 includes a plurality of partially-formed LED packages 128-1 to 128-9. While nine LED packages are illustrated, embodiments of the present disclosure are applicable to any number of LED packages, including more than one hundred LED packages in some embodiments. A plurality of first metal patterns 130-1 to 130-6 and a plurality of second metal patterns 132-1 to 132-6 are arranged on the panel 126 around a perimeter of the partially-formed LED packages 128-1 to 128-9. The plurality of first metal patterns 130-1 to 130-6 and the plurality of second metal patterns 132-1 to 132-6 are formed at the same time as metal patterns of the partially-formed LED packages 128-1 to 128-9 are formed. In some embodiments, the plurality of first metal patterns 130-1 to 130-6 include the same metal layer or layers as package contacts (e.g. 52-1, 52-2 of FIG. 4) of the partially-formed LED packages 128-1 to 128-9, and the plurality of second metal patterns 132-1 to 132-6 include the same metal or metal layers as die attach pads (e.g. 61-1 to 61-3 of FIG. 5A) of the partially-formed LED packages 128-1 to 128-9. In this regard, the first metal patterns 130-1 to 130-6 and the second metal patterns 132-1 to 132-6 may be tested and characterized after deposition without damaging or impacting metal layers of the partially-formed LED packages 128-1 to 128-9. In additional manufacturing steps, LED chips and ESD chips may be mounted to each of the partially-formed LED packages 128-1 to 128-9 as previously described. In further manufacturing steps, the light-altering material and the wavelength conversion element as previously described may be added to complete formation of the LED packages 128-1 to 128-9.

Embodiments disclosed herein may be particularly suited for an LED package that includes an array of LED chips, where each LED chip of the array of LED chips is individually controllable. In this manner, individual LED chips or subgroups of LED chips of the array of LED chips may be selectively activated or deactivated. Accordingly, LED packages according to the present disclosure may be beneficial for various applications, including those where a high luminous intensity with a controllable brightness or adaptable emission pattern is desired in a variety of environmental conditions. Such applications include automotive lighting, aerospace lighting, and general illumination environments such as vehicular headlamps, roadway illumination, light fixtures, and various indoor, outdoor, and specialty contexts. Some embodiments disclosed herein are related to LED packages that provide multiple illumination zones and the ability to selectively illuminate or avoid illumination of selected illumination targets.

FIG. 15A illustrates a top view of a partially-assembled LED package 134 according to some embodiments. The LED package 134 includes a submount 136 and a metal pattern 138 on the submount 136 as previously described. The metal pattern 138 includes a plurality of metal traces 138-1 to 138-11. Each metal trace 138-1 to 138-11 includes a continuous metal formed on a surface of the submount 136, and each metal trace 138-1 to 138-11 is discontinuous with each other. The metal pattern 138 forms a plurality of die attach pads 140-1 to 140-10 that are indicated by dashed-line boxes in FIG. 15A. The die attach pads 140-1 to 140-10 are configured to receive a plurality of LED chips. For example, the die attach pad 140-1 includes a portion of the metal trace 138-1 and a portion of the metal trace 138-2. Accordingly, an anode or a cathode of an LED chip may be mounted or attached to the metal trace 138-1 while the other of an anode or a cathode of the LED chip may be mounted or attached to the metal trace 138-2. In a similar manner, the die attach pad 140-2 includes a portion of the metal trace 138-1 and a portion of the metal trace 138-3, and the die attach pad 140-3 includes a portion of the metal trace 138-1 and a portion of the metal trace 138-4. Additionally, a portion of each metal trace 138-1 to 138-11 forms a plurality of bond pads 142-1 to 142-11. In that regard, the metal trace 138-1 is continuous with at least a portion of each of the die attach pads 140-1 to 140-10 as well as the bond pad 142-1, and the metal trace 138-2 is continuous with at least a portion of the die attach pad 140-1 and the bond pad 142-2, and so on. In some embodiments, at least a portion of the plurality of bond pads 142-1 to 142-11 are aligned along a first lateral edge 137 on a surface 139 of the submount 136. In a similar manner, the plurality of die attach pads 140-1 to 140-10 may be aligned substantially parallel to the plurality of bond pads.

In some embodiments, the plurality of bond pads 142-1 to 142-11 comprise a cathode pad 142-1 and a plurality of anode pads 142-2 to 142-11. In this manner, the metal trace 138-1 is a cathode metal trace, and each die attach pad 140-1 to 140-10 comprises a portion of the metal trace 138-1 that is continuous with the cathode pad 142-1. The metal traces 138-2 to 138-11 are a plurality of anode metal traces that are continuous with corresponding ones of the plurality of anode pads 142-2 to 142-11. In some embodiments, a bond metal as previously described for FIGS. 6A, 6B, and 6C is on the plurality of bond pads 142-1 to 142-11 and on a surface of the submount 136 that is adjacent the plurality of bond pads 142-1 to 142-11. In some embodiments, the bond metal comprises a conductive finger that extends on at least one metal trace of the plurality of metal traces 138-1 to 138-11 as previously described for FIGS. 9 and 10. For example, the conductive finger may extend on the metal trace 138-1 between the bond pad 142-1 to a position that is adjacent the die attach pad 140-1 in some embodiments. In further embodiments, conductive fingers may extend on the metal traces 138-2 to 138-11 to positions adjacent corresponding die attach pads 140-1 to 140-10. The metal trace 138-1 may further comprise a plurality of metal trace extensions 144-1 to 144-5 that extend between the die attach pads 140-1 to 140-10. In some embodiments, the plurality of metal trace extensions 144-1 to 144-5 do not extend between all of the die attach pads 140-1 to 140-10. For example, in FIG. 15A, the metal trace extension 144-1 extends between the die attach pads 140-1 and 140-2; the metal trace extension 144-2 extends between the die attach pads 140-3 and 140-4, and none of the metal trace extensions 144-1 to 144-5 extend between the die attach pads 140-2 and 140-3. The metal trace extensions 144-1 to 144-5 form a plurality of ESD attach pads 146 with the plurality of metal traces 138-2 to 138-11. In FIG. 15A, the ESD attach pads 146 are represented as pairs of small rectangular boxes in dashed lines. Ten ESD attach pads 146 are in FIG. 15A, although other numbers are possible depending on the number of die attach pads 140-1 to 140-10 present. Notably, two ESD attach pads 146 may comprise a portion of a single metal trace extension 144-1 to 144-5.

FIG. 15B illustrates a top view of the partially-assembled LED package 134 of FIG. 15A with a plurality of LED chips 148-1 to 148-10 and a plurality of ESD chips 150-1 to 150-10. The plurality of LED chips 148-1 to 148-10 are mounted to the die attach pads (140-1 to 140-10 of FIG. 15A), and the plurality of ESD chips 150-1 to 150-10 are mounted to the plurality of ESD attach pads (146 of FIG. 15A) of the metal pattern 138. In some embodiments, there are a same number of the ESD chips 150-1 to 150-10 as there are of the LED chips 148-1 to 148-10. In this regard, at least one of the ESD chips 150-1 to 150-10 is electrically connected to each metal trace of the plurality of metal traces 138-1 to 138-11. As previously described, the metal trace 138-1 includes the plurality of metal trace extensions 144-1 to 144-5. The plurality of metal trace extensions 144-1 to 144-5 extend between the plurality of LED chips 148-1 to 148-10 and between the plurality of metal traces 138-2 to 138-11, in a manner similar to the plurality of metal trace extensions 144-1 to 144-5 extending between the plurality of die attach pads 140-1 to 140-10 as previously described. The plurality of ESD chips 150-1 to 150-10 are electrically connected between the plurality of metal trace extensions 144-1 to 144-5 and the metal traces 138-2 to 138-11. In this manner, at least two of the ESD chips 150-1 to 150-10 may be electrically connected to the same metal trace extension 144-1 to 144-5. In some embodiments, the metal trace 138-1 comprises a cathode metal trace, and the metal traces 138-2 to 138-11 comprise a plurality of anode metal traces. In other embodiments, the polarity may be reversed such that the metal trace 138-1 comprises an anode metal trace, and the metal traces 138-2 to 138-11 comprise a plurality of cathode metal traces. In such configurations, each of the plurality of LED chips 148-1 to 148-10 are individually controllable through separate electrical paths. For example, in some configurations, the electrical path for the LED chip 148-1 comprises the cathode metal trace 138-1 and the anode metal trace 138-2, while the electrical path for the LED chip 148-2 comprises the same cathode metal trace 138-1 but a different anode metal trace 138-3. In this manner, each of the LED chips 148-1 to 148-10 may be selectively activated or deactivated independently of each other.

FIG. 16 illustrates a top view of an LED package 152 according to some embodiments. The LED package 152 is similar to the LED package 134 of FIG. 15B, except the LED package 152 includes a light-altering material 154 and a wavelength conversion element 156 as previously-described. As illustrated, the plurality of LED chips 148-1 to 148-10 are laterally separated from the of bond pads 142-1 to 142-11. The light-altering material 154 is arranged around a perimeter of the LED chips 148-1 to 148-10 on a surface of the submount 136. Notably, the light-altering material 154 covers the plurality of ESD chips 150-1 to 150-10 visible in FIG. 15B on the surface of the submount 136. ESD chips are typically dark in color and may therefore absorb light. The light-altering material 154 may include light reflective particles such as fused silica, fumed silica, or $TiO_2$ particles suspended in silicone, among others, as previously described. Accordingly, the amount of light from the LED chips 148-1 to 148-10 that may reach the ESD chips (150-1 to 150-10 of FIG. 15B) is reduced. In some embodiments, the light-altering material 154 does not cover the entire surface of the submount 136. In particular, at least a portion of each bond pad 142-1 to 142-11 is uncovered by the light-altering material 154. In that regard, the bond pads 142-1 to 142-11 form at least a portion of the package contacts (see, for example 52-1, 52-2 of FIG. 4). For embodiments where a bond metal is on the plurality of bond pads 142-1 to 142-11 and on a surface of the submount 136 as previously described, the light-altering material 154 may cover a portion of the bond metal on the submount 136.

The wavelength conversion element 156 is arranged over the plurality of LED chips 148-1 to 148-10 on the submount 136. Dashed vertical lines indicate boundaries between the LED chips 148-1 to 148-10 on the submount 136 and under the wavelength conversion element 156. In some embodiments, the light-altering material 154 is also arranged around a perimeter of the wavelength conversion element 156. The wavelength conversion element 156 may include one or more lumiphoric materials as previously described. In some embodiments, the wavelength conversion element 156 is a single wavelength conversion element 156 on the plurality of LED chips 148-1 to 148-10. In that regard, the single wavelength conversion element 156 covers each of the independently controllable LED chips 148-1 to 148-10. Each LED chip 148-1 to 148-10, when electrically activated, will provide light to different portions of the single wavelength conversion element 156. In some embodiments, adjacent LED chips (e.g., 148-1 and 148-2) of the LED chips 148-1 to 148-10 may provide light to overlapping portions of the single wavelength conversion element 156. In this manner, boundaries between activated ones of the LED chips 148-1 to 148-10 may be less noticeable. For example, if the LED chips 148-1 and 148-2 are activated and the LED chip 148-3 is not activated, then aggregated emissions from the LED chips 148-1 and 148-2 and the wavelength conversion element 156 may appear as a single emission area over where the LED chips 148-1 and 148-2 are mounted. If all of the LED chips 148-1 to 148-10 are activated, then aggregated emissions from the LED chips 148-1 to 148-10 and the wavelength conversion element 156 may appear as a single emission area within the entire area bounded by the light-altering material 154. In an automotive headlight application, some LED chips may be deactivated to avoid emitting light toward an object in the field of view while other LED chips that are activated may appear as a uniform emission area.

FIG. 17 illustrates a top view of an LED package 158 according to some embodiments. The LED package 158 is similar to the LED package 152 of FIG. 16, except the LED package 158 includes a plurality of wavelength conversion elements 160-1 to 160-10 over the plurality of LED chips 148-1 to 148-10. In particular, individual wavelength conversion elements 160-1 to 160-10 are on or registered with individual LED chips of the plurality of LED chips 148-1 to 148-10. As previously described, each wavelength conversion element 160-1 to 160-10 may include a superstrate and a lumiphoric material. In some embodiments, the light-altering material 154 as previously described is arranged around a perimeter of the plurality of LED chips 148-1 to 148-10 and between adjacent LED chips of the plurality of LED chips 148-1 to 148-10. In a similar manner, the light-altering material 154 is also arranged around a perimeter the plurality of wavelength conversion elements 160-1 to 160-10 and between adjacent wavelength conversion elements of the plurality of wavelength conversion elements 160-1 to 160-10. In this manner, boundaries between activated LED chips of the plurality of LED chips 148-1 to 148-10 may be more noticeable. For example, if the LED chip 148-1 and the LED chip 148-2 are activated, aggregated emissions from the LED chip 148-1 and the wavelength conversion element 160-1 may be spatially segregated from aggregated emissions from the LED chip 148-2 and the wavelength conversion element 160-2 by the light-altering material 154, thereby improving contrast between the LED chips 148-1 and 148-2. In this regard, the LED chips 148-1 to 148-10 may serve as individual pixels as they are activated or deactivated independently of each other. In an automotive headlight application, the LED chips in the middle of the LED package 158, such as the LED chips 148-4, 148-5, 148-6, and 148-7 may be deactivated with higher contrast to avoid emitting light toward an object in the field of view while the LED chips 148-1 to 148-3 and 148-8 to 148-10 may be activated to emit light on either side of the object. Emission boundaries between electrically activated LED chips and electrically deactivated LED chips of the LED chips 148-1 to 148-10 may have improved contrast due the presence of the light-altering material 154 in between.

Figure 18A:
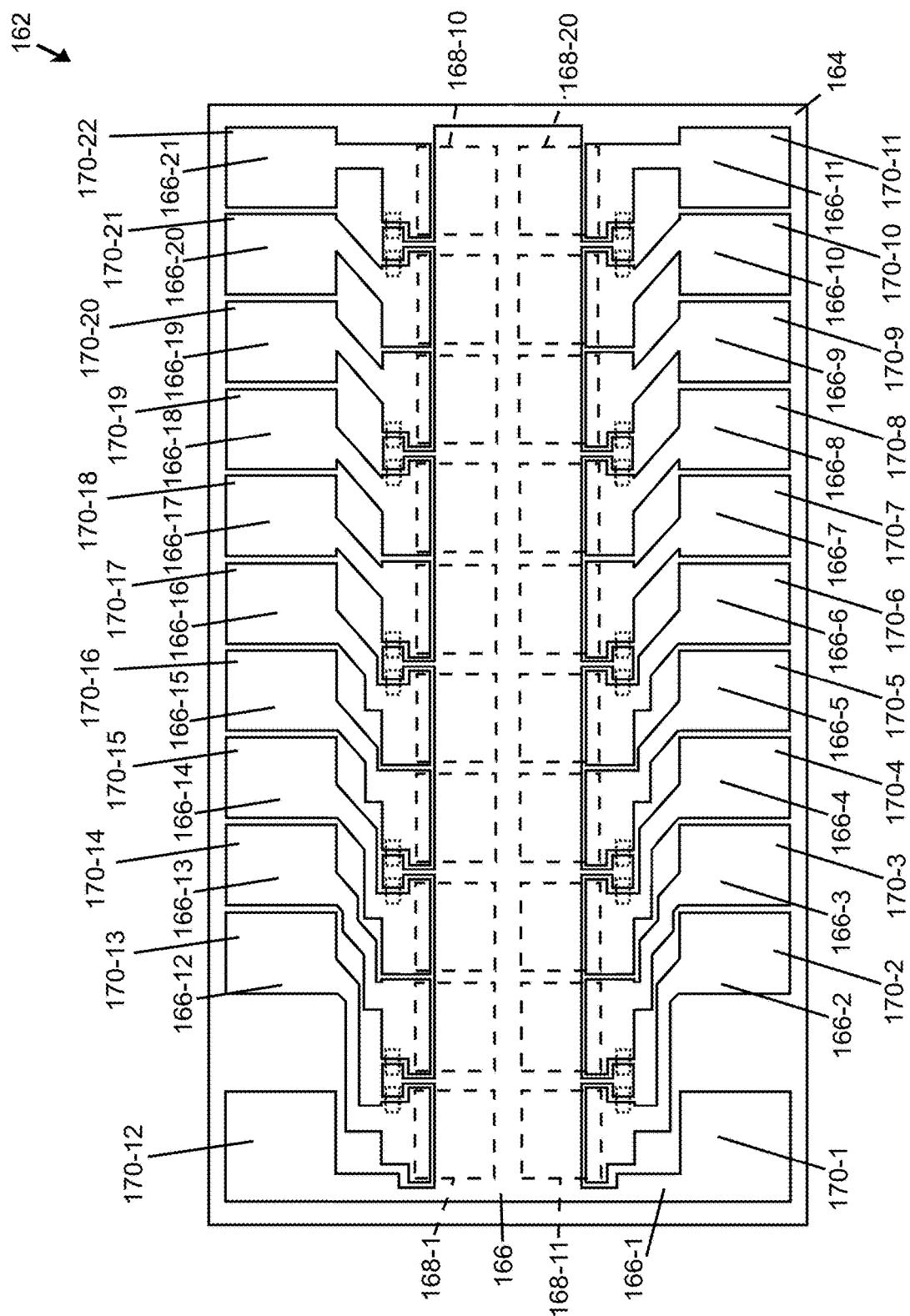
FIG. 18A illustrates a top view of a partially-assembled LED package according to some embodiments.

FIG. 18A illustrates a top view of a partially-assembled LED package 162 that is similar to the partially assembled LED package 134 of FIG. 15A, but is configured to have a plurality of individually controllable LED chips mounted in at least two adjacent rows. The LED package 162 includes a submount 164 and a metal pattern 166 on the submount 164 as previously described. The metal pattern 166 includes a plurality of metal traces 166-1 to 166-21. Each metal trace 166-1 to 166-21 includes a continuous metal formed on a surface of the submount 164, and each metal trace 166-1 to 166-21 is discontinuous with each other. The metal pattern 166 forms a plurality of die attach pads 168-1 to 168-20 that are indicated by dashed-line boxes in FIG. 15A. For simplicity, only die attach pads 168-1, 168-10, 168-11, and 168-20 are labeled in FIG. 15A. The die attach pads 168-1 to 168-20 are configured to receive a plurality of LED chips in two adjacent rows. Each die attach pad 168-1 to 168-20 includes a portion of the metal trace 166-1 and a different one of the metal traces 166-2 to 166-21. Accordingly, an anode or a cathode of an LED chip may be mounted or attached to each die attach pad 168-1 to 168-20. Notably, a first subset of metal traces 166-2 to 166-11 extend in an opposite direction on the submount 164 than a second subset of metal traces 166-12 to 166-21. Additionally, a portion of each metal trace 166-1 to 166-21 forms a plurality of bond pads 170-1 to 170-22. The bond pads 170-1 to 170-11 are near an edge of the submount 164 that is opposite to an edge of the submount 164 where the bond pads 170-12 to 170-22 are located. Accordingly, electrical connections for the LED package 162 are made from opposing edges of the submount 164. The metal trace 166-1 is continuous with at least a portion of each of the die attach pads 168-1 to 168-20 as well as the bond pads 170-1 and 170-12, while each of the other metal traces 166-2 to 166-21 are continuous with different ones of the plurality of die attach pads 168-1 to 168-20.

In some embodiments, the plurality of bond pads 170-1 to 170-22 comprise one or more cathode pads 170-1 and 170-12 and a plurality of anode pads 170-2 to 170-11 and 170-13 to 170-22. In this manner, the metal trace 166-1 is a cathode metal trace, and each die attach pad 168-1 to 168-20 comprises a portion of the metal trace 166-1 that is continuous with the cathode pads 170-1 and 170-12. The metal traces 166-2 to 166-21 are a plurality of anode metal traces that are continuous with corresponding ones of the plurality of anode pads 170-2 to 170-11 and 170-13 to 170-22. In some embodiments, a bond metal as previously described for FIGS. 6A, 6B, and 6C is on the plurality of bond pads 170-1 to 170-22 and on a surface of the submount 164 that is adjacent the plurality of bond pads 170-1 to 170-22. In some embodiments, the bond metal comprises a conductive finger that extends on at least one metal trace of the plurality of metal traces 166-1 to 166-21 as previously described for FIGS. 9 and 10. For example, the conductive finger may extend on the metal trace 166-1 between the bond pads 170-1 and 170-12 to a position that is adjacent the die attach pads 168-1 and 168-11 in some embodiments. In further embodiments, conductive fingers may extend on the metal traces 166-2 to 166-21 to positions adjacent corresponding die attach pads 168-2 to 168-10 and 168-12 to 168-20.

FIG. 18B illustrates a top view of the partially-assembled LED package 162 of FIG. 18A with a plurality of LED chips 172-1 to 172-20 and a plurality of ESD chips 174-1 to 174-20. The plurality of LED chips 172-1 to 172-20 are mounted to the plurality of die attach pads 168-1 to 168-20 of FIG. 18A, and the plurality of ESD chips 174-1 to 174-20 are mounted to the LED package 162 in a similar manner as previously described for FIG. 15A. Accordingly, each of the plurality of LED chips 172-1 to 172-20 are individually controllable through separate electrical paths. Notably, the plurality of LED chips 172-1 to 172-20 are arranged in rows that are adjacent to each other. In this arrangement, corresponding bond pads may be accessible at more than one edge of the submount 164.

FIG. 19 illustrates a top view of an LED package 176 according to some embodiments. The LED package 176 is similar to the LED package 162 of FIG. 18B, except the LED package 176 includes a light-altering material 178 and a wavelength conversion element 180 as previously-described. The light-altering material 178 is arranged around a perimeter of the LED chips 172-1 to 172-20 on a surface of the submount 164. Notably, the light-altering material 178 covers the plurality of ESD chips 174-1 to 174-20 visible in FIG. 18B on the surface of the submount 164. In some embodiments, the light-altering material 178 does not cover the entire surface of the submount 164. In particular, at least a portion of each bond pad 170-1 to 170-22 is uncovered by the light-altering material 178. In that regard, the bond pads 170-1 to 170-22 form at least a portion of the package contacts (see, for example 52-1, 52-2 of FIG. 4). For embodiments where a bond metal is on the plurality of bond pads 170-1 to 170-22 and on a surface of the submount 164 as previously described, the light-altering material 178 may cover a portion of the bond metal on the submount 164. The wavelength conversion element 180 is arranged over the plurality of LED chips 172-1 to 172-20 on the submount 164. Dashed lines indicated boundaries between individual ones of the LED chips 172-1 to 172-20 on the submount 164 and under the wavelength conversion element 180. In some embodiments, the light-altering material 178 is also arranged around a perimeter of the wavelength conversion element 180. The wavelength conversion element 180 may include one or more lumiphoric materials as previously described. As with the wavelength conversion element 156 of FIG. 16, the wavelength conversion element 180 may comprise a single wavelength conversion element 180 on the plurality of LED chips 172-1 to 172-20. In that regard, the single wavelength conversion element 180 covers each of the independently controllable LED chips 172-1 to 172-20.

Figure 20:
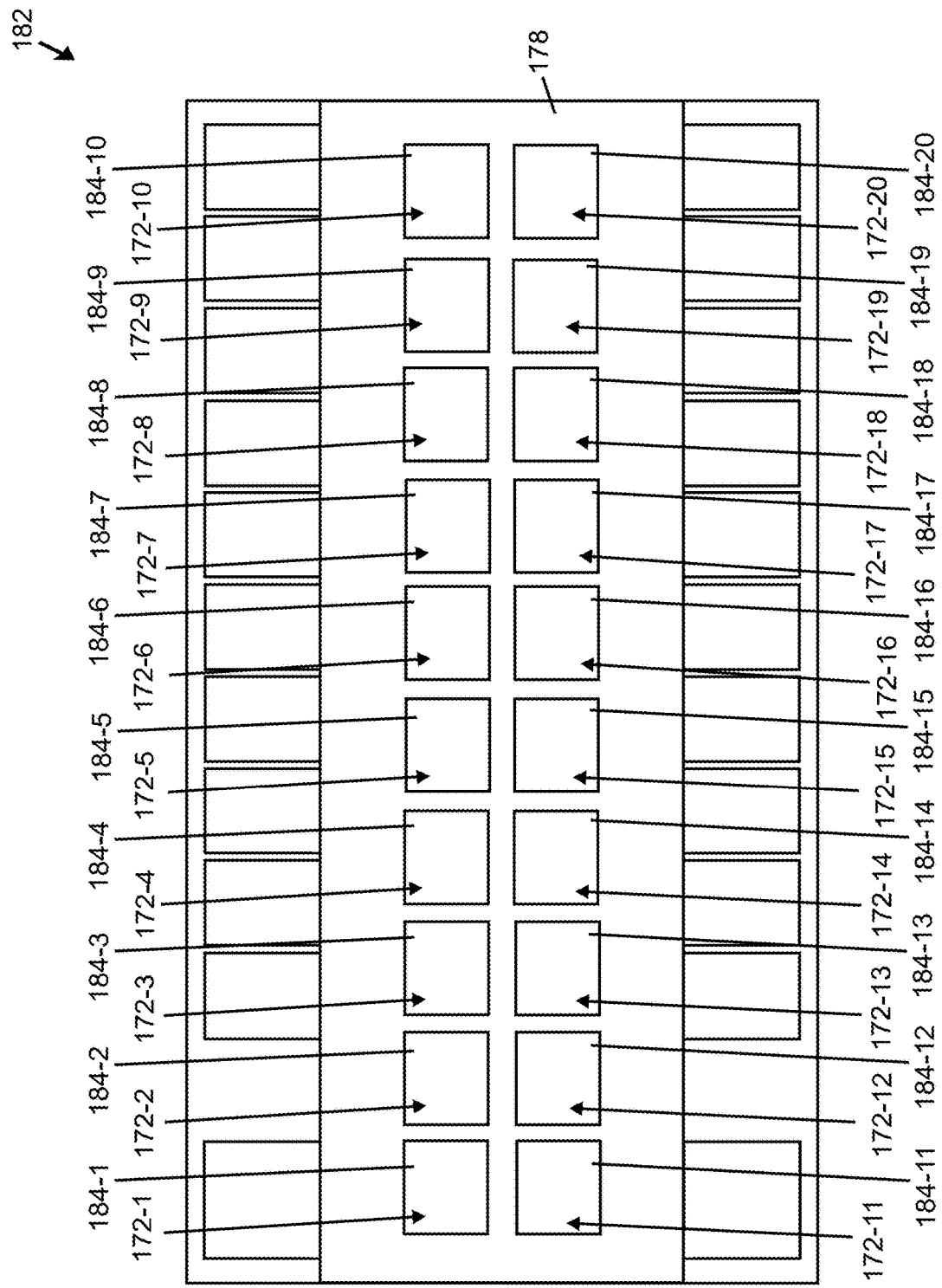
FIG. 20 illustrates a top view of an LED package according to some embodiments.

FIG. 20 illustrates a top view of an LED package 182 according to some embodiments. The LED package 182 is similar to the LED package 176 of FIG. 19, except the LED package 182 includes a plurality of wavelength conversion elements 184-1 to 184-20 over the plurality of LED chips 172-1 to 172-20. In particular, individual wavelength conversion elements 184-1 to 184-20 are on or registered with individual LED chips of the plurality of LED chips 172-1 to 172-20. As previously described, each wavelength conversion element 184-1 to 184-20 may include a superstrate and a lumiphoric material. In some embodiments, the light-altering material 178 as previously described is arranged around a perimeter of the plurality of LED chips 172-1 to 172-20 and between adjacent LED chips of the plurality of LED chips 172-1 to 172-20. In a similar manner, the light-altering material 178 is also arranged around a perimeter of the plurality of wavelength conversion elements 184-1 to 184-20 and between adjacent wavelength conversion elements of the plurality of wavelength conversion elements 184-1 to 184-20. In this manner, boundaries between activated LED chips may be more noticeable. For example, if the LED chip 172-1 and the LED chip 172-2 are activated, aggregated emissions from the LED chip 172-1 and the wavelength conversion element 184-1 may be spatially segregated from aggregated emissions from the LED chip 172-2 and the wavelength conversion element 184-2 by the light-altering material 178. Accordingly, contrast between the LED chips 172-1 and 172-2 is improved when either of the LED chips 172-1 and 172-2 are activated or deactivated. In this regard, the LED chips 172-1 to 172-20 may serve as individual pixels as they are activated or deactivated independently of each other.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
a submount;
a metal pattern on the submount, wherein the metal pattern comprises:
a plurality of attach pads; and
a plurality of bond pads;
wherein each of the plurality of attach pads and the plurality of bond pads is formed of a first metal layer on the submount, and a second metal layer that is on the first metal layer and on sidewalls of the first metal layer such that the second metal layer is directly on a surface of the submount that is adjacent the first metal layer;
a plurality of LED chips mounted on the plurality of attach pads, wherein each LED chip of the plurality of LED chips is individually controllable;
a bond metal on the plurality of bond pads and on a surface of the submount that is adjacent the plurality of bond pads, wherein the plurality of attach pads are uncovered by the bond metal; and
a light-altering material on the surface of the submount, wherein the bond metal covers portions of the plurality of bond pads that are uncovered by the light-altering material and a top portion of the bond metal is covered by the light-altering material.

2. The LED package of claim 1 wherein the light-altering material is arranged around a perimeter of the plurality of LED chips on the surface of the submount.

3. The LED package of claim 2 wherein the light-altering material comprises a light-reflective material.

4. The LED package of claim 3 wherein the light-reflective material comprises fused silica, fumed silica, or titanium dioxide ($TiO_2$) particles suspended in silicone.

5. The LED package of claim 1 further comprising a single wavelength conversion element on the plurality of LED chips.

6. The LED package of claim 1 further comprising a separate wavelength conversion element on each LED chip of the plurality of LED chips.

7. The LED package of claim 1 wherein the light-altering material is arranged around a perimeter of the plurality of LED chips and between adjacent LED chips of the plurality of LED chips.

8. The LED package of claim 1 wherein the metal pattern comprises a plurality of metal traces that electrically connect between individual attach pads of the plurality of attach pads and individual bond pads of the plurality of bond pads.

9. The LED package of claim 8 further comprising at least one electrostatic discharge (ESD) chip electrically connected to each metal trace of the plurality of metal traces.

10. The LED package of claim 8 wherein the bond metal comprises a conductive finger that extends on at least one metal trace of the plurality of metal traces.

11. The LED package of claim 1 wherein the plurality of bond pads comprise a cathode pad and a plurality of anode pads.

12. The LED package of claim 10 wherein the conductive finger only partially extends on at least one metal trace of the plurality of metal traces.

13. The LED package of claim 11 wherein each attach pad of the plurality of attach pads comprises a portion of a cathode metal trace that is continuous with the cathode pad and a plurality of anode metal traces that are continuous with corresponding anode pads of the plurality of anode pads.

14. The LED package of claim 13, wherein the cathode metal trace comprises a plurality of metal trace extensions that extend between the plurality of LED chips and between the plurality of anode metal traces.

15. The LED package of claim 14 wherein a plurality of electrostatic discharge (ESD) chips are electrically connected between the plurality of metal trace extensions and the plurality of anode metal traces.

16. The LED package of claim 15 wherein at least two ESD chips of the plurality of ESD chips are electrically connected to a same metal trace extension of the plurality of metal trace extensions.

17. The LED package of claim 16 wherein at least a portion of the plurality of bond pads are aligned along a first lateral edge on a surface of the submount and at least a portion of the plurality of attach pads are aligned substantially parallel to the plurality of bond pads.

18. The LED package of claim 1, wherein the second metal layer comprises electroless gold plating and the bond metal comprises aluminum.

19. A light-emitting diode (LED) package comprising:
a submount;
a metal pattern on the submount, wherein the metal pattern comprises:
  a plurality of attach pads;
  a plurality of bond pads that include a first group of bond pads arranged closer to a first edge of the submount and a second group of bond pads arranged closer to a second edge of the submount; and
  a metal trace that is continuous with a first bond pad of the first group of bond pads and a second bond pad of the second group of bond pads;
a bond metal on the first bond pad and the second bond pad, the bond metal forming a conductive finger that extends on only a top surface of the metal trace between the first bond pad and the second bond pad, wherein the bond metal is on the plurality of bond pads and on a surface of the submount that is adjacent the plurality of bond pads;
a plurality of LED chips mounted on the plurality of attach pads and arranged in at least two adjacent rows that are arranged between the first group of bond pads and the second group of bond pads, wherein each LED chip of the plurality of LED chips is individually controllable; and
a light-altering material arranged around a perimeter of the plurality of LED chips on a surface of the submount, wherein the plurality of bond pads are at least partially uncovered by the light-altering material.

20. The LED package of claim 19 further comprising a single wavelength conversion element on the plurality of LED chips.

21. The LED package of claim 19 further comprising a separate wavelength conversion element on each LED chip of the plurality of LED chips.

22. The LED package of claim 19 wherein the first bond pad and the second bond pad comprise cathode pads and the plurality of bond pads further comprises a plurality of anode pads.

23. The LED package of claim 22 wherein the metal trace comprises a cathode metal trace and each attach pad of the plurality of attach pads comprises a portion of the cathode metal trace, and the metal pattern further comprises a plurality of anode metal traces and each anode metal trace is continuous with at least one anode pad of the plurality of anode pads and at least one attach pad of the plurality of attach pads.

24. A light-emitting diode (LED) package comprising:
a submount;
a plurality of bond pads on the submount;
a plurality of metal traces that are electrically coupled with the plurality of bond pads;
a bond metal on the plurality of bond pads and on a surface of the submount that is adjacent the plurality of bond pads, wherein a portion of the bond metal partially extends on at least one metal trace of the plurality of metal traces to form a conductive finger on a only a top surface of a first metal trace of the plurality of metal traces;
a plurality of LED chips mounted on the submount, wherein the plurality of LED chips are laterally spaced from the plurality of bond pads, and the conductive finger partially extends on the first metal trace to a position adjacent a first LED chip of the plurality of LED chips;
a plurality of wavelength conversion elements on the plurality of LED chips, wherein each wavelength conversion element of the plurality of wavelength conversion elements comprises a superstrate and a lumiphoric material, and wherein individual wavelength conversion elements are registered with individual LED chips of the plurality of LED chips such that the lumiphoric material of each wavelength conversion element is arranged between the superstrate of each wavelength conversion element and the submount; and
a light-altering material arranged around a perimeter of the plurality of LED chips and between adjacent LED chips of the plurality of LED chips, wherein the bond metal covers portions of the plurality of bond pads that are uncovered by the light-altering material and the portion of the bond metal that partially extends on the plurality of metal traces is covered by the light-altering material.

25. The LED package of claim 24 wherein the light-altering material is arranged around a perimeter of the plurality of wavelength conversion elements and between adjacent wavelength conversion elements of the plurality of wavelength conversion elements.

* * * * *